(12) United States Patent
Fujimura et al.

(10) Patent No.: US 12,248,242 B2
(45) Date of Patent: Mar. 11, 2025

(54) METHODS AND SYSTEMS FOR RETICLE ENHANCEMENT TECHNOLOGY OF A DESIGN PATTERN TO BE MANUFACTURED ON A SUBSTRATE

(71) Applicant: D2S, Inc., San Jose, CA (US)

(72) Inventors: Akira Fujimura, Saratoga, CA (US); P. Jeffrey Ungar, Belmont, CA (US); Nagesh Shirali, San Jose, CA (US)

(73) Assignee: D2S, Inc., San Jose, CA (US)

( * ) Notice: Subject to any disclaimer, the term of this patent is extended or adjusted under 35 U.S.C. 154(b) by 0 days.

(21) Appl. No.: 18/601,592

(22) Filed: Mar. 11, 2024

(65) Prior Publication Data
US 2024/0210815 A1    Jun. 27, 2024

Related U.S. Application Data

(63) Continuation of application No. 18/318,316, filed on May 16, 2023, now Pat. No. 11,953,824, which is a continuation of application No. 17/444,142, filed on Jul. 30, 2021, now Pat. No. 11,693,306.

(51) Int. Cl.
*G03F 1/36* (2012.01)
*G03F 1/78* (2012.01)

(52) U.S. Cl.
CPC . *G03F 1/36* (2013.01); *G03F 1/78* (2013.01)

(58) Field of Classification Search
CPC ..................................... G03F 1/36; G03F 1/78
USPC ............................................................ 430/5
See application file for complete search history.

(56) References Cited

U.S. PATENT DOCUMENTS

| | | |
|---|---|---|
| 7,001,693 B2 | 2/2006 | Liebmann et al. |
| 7,754,401 B2 | 7/2010 | Fujimura et al. |
| 7,902,528 B2 | 3/2011 | Hara et al. |
| 8,329,365 B2 | 12/2012 | Fujimura et al. |
| 8,719,739 B2 | 5/2014 | Fujimura et al. |
| 9,170,481 B2 | 10/2015 | Rieger et al. |
| 9,323,140 B2 | 4/2016 | Fujimura |
| 9,372,391 B2 | 6/2016 | Fujimura et al. |
| 9,430,607 B2 | 8/2016 | Tao et al. |
| 9,471,746 B2 | 10/2016 | Rieger et al. |
| 10,318,697 B2 | 6/2019 | Rieger et al. |
| 10,872,188 B2 | 12/2020 | Rosenbluth |
| 10,877,380 B1 | 12/2020 | Lin et al. |
| 10,909,294 B2 | 2/2021 | Ungar |
| 11,783,110 B2 | 10/2023 | Fujimura et al. |
| 12,019,973 B2 | 6/2024 | Fujimura et al. |
| 2012/0064440 A1 | 3/2012 | Fujimura et al. |
| 2013/0283218 A1 | 10/2013 | Fujimura et al. |
| 2016/0042118 A1 | 2/2016 | Rieger et al. |
| 2020/0096876 A1 | 3/2020 | Lin et al. |
| 2023/0035090 A1 | 2/2023 | Fujimura et al. |

FOREIGN PATENT DOCUMENTS

| | | |
|---|---|---|
| EP | 2321840 B1 | 5/2017 |
| WO | 2014127850 A1 | 8/2014 |

OTHER PUBLICATIONS

International Search Report and Written Opinion dated Nov. 11, 2022 for PCT Patent Application No. PCT/IB2022/056722.
Notice of Allowance and Fees dated Dec. 21, 2023 for U.S. Appl. No. 18/318,316.
Notice of Allowance and Fees dated Feb. 27, 2023 for U.S. Appl. No. 17/444,142.
Notice of Allowance and Fees dated Mar. 10, 2023 for U.S. Appl. No. 17/444,140.
Office Action dated Jan. 12, 2023 for U.S. Appl. No. 17/444,140.
Office Action dated Oct. 4, 2023 for U.S. Appl. No. 18/318,602.
Pang et al., Enabling Faster VSB Writing of 193i Curvilinear ILT Masks That Improve Wafer Process Windows for Advanced Memory Applications, D2S, Inc. and Micron Technology, Inc., Sep. 17, 2020.
Pang et al., TrueMask® ILT MWCO: Full-chip curvilinear ILT in a day and full mask multi-beam and VSB writing in 12 hrs for 193i, SPIE Advanced Lithography, Proc. of SPIE vol. 11327, Apr. 1, 2020, pp. 113270K-1-113270K-14.
Pearman, et al., How utilizing curvilinear design enables better manufacturing process window, SPIE Advanced Lithography, (Mar. 23, 2020, 10 pgs, San Jose, California.
R.C. Pack et al., "Model-based Virtual VSB Mask Writer Verification for Efficient Mask Error Checking and Optimization Prior to MDP," Proc. SPIE 9235, Photomask Technology 2014, 13 pages. (Year: 2014).
Office Action dated Nov. 21, 2024 for U.S. Appl. No. 18/657,435.

*Primary Examiner* — Christopher G Young
(74) *Attorney, Agent, or Firm* — MLO, a professional corp.

(57) ABSTRACT

Methods and systems for fracturing a pattern to be exposed on a surface using variable shaped beam (VSB) lithography include inputting an initial pattern; calculating a first substrate pattern from the initial pattern; overlaying the initial pattern with a two-dimensional grid, wherein an initial set of VSB shots are formed by a union of the initial pattern with locations on the grid; and merging two or more adjacent shots in the initial set of VSB shots to create a larger shot in a modified set of VSB shots; and outputting the modified set of VSB shots. The methods and systems also include calculating a calculated pattern to be exposed on the surface with the modified set of VSB shots; and calculating a second substrate pattern from the calculated pattern to be exposed on the surface.

20 Claims, 17 Drawing Sheets

610

620

630

640

METHODS AND SYSTEMS FOR RETICLE ENHANCEMENT TECHNOLOGY OF A DESIGN PATTERN TO BE MANUFACTURED ON A SUBSTRATE

RELATED APPLICATIONS

This application is a continuation of U.S. patent application Ser. No. 18/318,316, entitled "Method for Reticle Enhancement Technology of a Design Pattern to be Manufactured on a Substrate," filed on May 16, 2023; which is a continuation of U.S. patent application Ser. No. 17/444,142, entitled "Method for Reticle Enhancement Technology of a Design Pattern to be Manufactured on a Substrate," filed on Jul. 30, 2021, and issued as U.S. Pat. No. 11,693,306; all of which are hereby incorporated by reference for all purposes. This application is related to Fujimura, U.S. patent application Ser. No. 17/444,140, entitled "Method for Reticle Enhancement Technology of a Design Pattern to be Manufactured on a Substrate," filed on Jul. 30, 2021, and issued as U.S. Pat. No. 11,783,110, which is hereby incorporated by reference for all purposes.

BACKGROUND

Submicron manufacturing uses lithographic techniques to build up layers of materials on a substrate to create transistors, diodes, light-emitting diodes (LEDS), capacitors, resistors, inductors, sensors, wires, optical wires, microelectromechanical systems (MEMS) and other elements which collectively produce a device that serves some function. Substrate lithography is a printing process in which a mask, sometimes called a reticle, is used to transfer patterns to a substrate to create the device. In the production or manufacturing of a device, such as an integrated circuit or a flat panel display, substrate lithography may be used to fabricate the device. When the device to be created is an integrated circuit, typically the substrate is a silicon wafer. In creating an integrated circuit, the lithography is semiconductor lithography which for high volume production is typically a substrate lithography. Other substrates could include flat panel displays, liquid panel display, a mask for flat panel display, nanoimprint masters, or other substrates, even other masks.

In semiconductor lithography, the mask or multiple masks may contain a circuit pattern corresponding to an individual layer, or a part of a layer in multiple patterning processes, of the integrated circuit. This pattern can be imaged onto a certain area on the substrate that has been coated with a layer of radiation-sensitive material known as photoresist or resist. Once the patterned layer is transferred, the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices, which may be integrated circuits, will be present on the substrate. These devices may then be separated from one another by dicing or sawing and then may be mounted into individual packages.

Optical lithography may be 193 nm light, with or without immersion, or extreme ultraviolet (EUV) or X-ray lithography, or any other frequencies of light or any combination thereof.

Optical lithography that uses 193 nm light waves works with refractive optics and transmissive photomasks or reticles. The masks block, partially block, or transmit the light waves selectively onto a substrate, which is typically resist-coated during the lithographic process to partially expose or to expose different parts of the substrate or some material on the substrate. The masks are typically at 4× magnification of the target substrate dimensions.

Extreme Ultraviolet Lithography (EUV) uses approximately 13.5 nm wavelength of light with reflective optics. Some implementations use an anamorphic mask with magnifications of 8× in one dimension and 4× in the other dimension.

In general, smaller wavelengths of light are able to resolve finer geometries, finer spaces in between geometries, and a higher frequency (density) of features on the substrate. Also in general, smaller wavelengths of light are more difficult to reliably produce and control. Economically, it is best to use the largest wavelength of light that is able to resolve the feature sizes, spaces, and frequencies that are needed for the device. It is therefore of interest to enhance the resolution achievable on the substrate with any given wavelength(s) of light.

For any lithography of a particular resolution, additional techniques such as off-axis illumination, phase shift masks, and multiple patterning extend the resolution capabilities. When multiple patterning is used, a single substrate layer is exposed multiple times, each time using a different mask which is called a mask layer.

There are a number of charged particle beam technologies. Three common types of charged particle beam lithography are variable shaped beam (VSB), character projection (CP), and multi-beam projection. The most commonly used system for leading edge mask production is VSB. VSB and CP are sub-categories of shaped beam charged particle beam lithography, in which an electron beam (eBeam) is shaped by a series of apertures and steered to expose a resist-coated surface. For purposes of this disclosure, a shot is the exposure of some surface area over a period of time. The area may be comprised of multiple discontinuous smaller areas. A shot may be comprised of a plurality of other shots which may or may not overlap, and which may or may not be exposed simultaneously. A shot may comprise a specified dose, or the dose may be unspecified. Shots may use a shaped beam, an unshaped beam, or a combination of shaped and unshaped beams. Multi-beam uses a plurality of charged particle beams whereas VSB and CP machines typically have a single beam.

For mask layers having the smallest features, masks are created by eBeam lithography. In eBeam lithography electrons expose an area of photo resist, or shot coating a surface of a mask, which is then processed to produce the desired openings in the mask. The amount of energy delivered in the shot is called a dose, which may have no energy at a dose set to 0.0 and a nominal dose set to 1.0 by convention. A pattern will be registered when the dose exceeds a certain threshold, which is often near 0.5 by convention. Critical dimension (CD) variation is, among other things, inversely related to the slope of the dosage curve at the resist threshold. This inverse relationship is called edge slope or dose margin.

It is difficult to print features whose size is similar to or smaller than the wavelength of the light used for lithography. The industry has applied various techniques to address the difficulty of reliably printing a desired pattern on a substrate. A computational lithography field has emerged to use computing to enhance substrate lithography, which in semiconductor lithography is also referred to as wafer lithography. Reticle Enhancement Technologies (RET) include computational methods and systems to design the target reticle shapes with which to project the desired pattern on the substrate more precisely and more reliably across manufacturing variation. RET often use computation to enhance an image on a mask, to print a desired substrate pattern more accurately and more reliably with resilience to manufacturing variation. The two common techniques in RET are Optical Proximity Correction (OPC) and Inverse Lithography Technology (ILT). Both techniques adjust parameters defining the mask until the desired pattern on the substrate is within acceptable tolerances for a set or a range of conditions. Conventional OPC is rule based-mask features are assessed and adjusted for compliance with a set of mask rules, for example related to minimal width, area, and spacing of mask features, as well as other parameters. OPC manipulates mask geometries and adjusts the wafer pattern near target edges.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used in both OPC and ILT to improve the transfer of the pattern is a sub-resolution assist feature (SRAF). It is often the case that the precision demanded of the surface manufacturing process for SRAFs is less than the precision demanded for patterns that are intended to print on the substrate, often referred to as main features. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding OPC features to a mask pattern is advantageous, it also substantially increases the total feature count in the mask pattern.

Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. This is even though the objective might be to produce exactly the same shape on the wafer. These slight but critical variations are important and have prevented others from being able to form reticle patterns. It is conventional to discuss the OPC-decorated patterns to be written on a reticle in terms of main features, that is features that reflect the design before OPC decoration, and OPC features, where OPC features might include SRAFs. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations such as corner rounding will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed.

OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the main features on the mask. As process nodes continue to shrink, the size of the smallest SRAFs on a photomask also shrinks. For example, at the 20 nm logic process node, 40 nm to 60 nm SRAFs are needed on the mask for the highest precision layers.

ILT often involves iterative optimization algorithms. ILT is able to manipulate the mask transmission as pixels, and ILT typically simulates the entire wafer pattern, a process known as dense simulation, rather than adjusting shapes only near target edges as is commonly done in OPC. An iterative optimization algorithm for ILT typically consists of: (1) evaluate a proposed solution to assign a cost which is trying to be minimized; (2) if cost is below a cost criteria, stop; (3) calculate a gradient for each element of the proposed solution which would lead to a lower cost; (4) adjust the proposed solution according to the calculated gradients; (5) go back to (1). Costs are typically defined with positive values where zero is the best possible score as assumed here. However, alternative cost definitions may be used.

RET in general means to improve the printability of all desired features at nominal (expected) manufacturing conditions and within expected manufacturing variation around the nominal manufacturing conditions. Since manufacturing processes are not perfect, the design needs to be resilient to certain expected manufacturing variation. A larger process window means more resiliency to manufacturing variation, specifically that pattern discrepancies through defocus and dose variation are within an acceptable tolerance. Providing sufficient process window for as many of the features as possible is a goal of RET. The percentage of chips that function as specified after fabrication is often referred to as the yield. Many factors affect yield. Improving the process window is generally considered among those skilled in the art to correlate to improving yield.

SUMMARY

In some embodiments, a method for reticle enhancement technology (RET) for use with variable shaped beam (VSB) lithography includes inputting a desired pattern to be formed on a substrate; determining an initial mask pattern from the desired pattern for the substrate; optimizing the initial mask pattern for wafer quality using a VSB exposure system, thereby creating an optimized mask pattern; and outputting the optimized mask pattern.

In some embodiments, a method for fracturing a pattern to be exposed on a surface using variable shaped beam (VSB) lithography includes inputting an initial pattern; overlaying the initial pattern with a two-dimensional grid, wherein an initial set of VSB shots are formed by a union of the initial pattern with locations on the grid; merging two or more adjacent shots in the initial set of VSB shots to create a larger shot in a modified set of VSB shots; and outputting the modified set of VSB shots.

In some embodiments, a method for fracturing a pattern to be exposed on a surface using variable shaped beam (VSB) lithography includes inputting an initial pattern; calculating a first substrate pattern from the initial pattern;

overlaying the initial pattern with a two-dimensional grid, wherein an initial set of VSB shots are formed by a union of the initial pattern with locations on the grid; and merging two or more adjacent shots in the initial set of VSB shots to create a larger shot in a modified set of VSB shots; and outputting the modified set of VSB shots. The method also includes calculating a calculated pattern to be exposed on the surface with the modified set of VSB shots; and calculating a second substrate pattern from the calculated pattern to be exposed on the surface.

Systems for performing the methods are also disclosed.

DETAILED DESCRIPTION OF THE EMBODIMENTS

In this disclosure, use of the term wafer lithography shall refer to substrate lithography in general. That is, embodiments shall be described in terms of semiconductor lithography as an example to simplify comprehension, but the embodiments apply also to other types of substrate lithography and to overall reticle enhancement technology. The term "substrate" in this disclosure can refer to a mask used in lithography, a silicon wafer, flat panel displays, a liquid panel display, a mask for flat panel display, nanoimprint masters, or other substrates, or other masks.

Some embodiments of the present disclosure describe a method of Reticle Enhancement Technology (RET) that can substantially improve the precision, reliability, and resilience to manufacturing variability of a mask that is used to transfer a design pattern to a substrate in semiconductor lithography. A trial mask pattern produced using methods of the present disclosure can significantly outperform a mask pattern produced using conventional OPC methods, without conventional increases in calculation runtime or write time to handle curvilinear shapes on a VSB system. Steps addressed in some embodiments in the present disclosure can be incorporated into or replace conventional methods for RET, Mask Data Preparation, and Mask Process Correction associated with traditional semiconductor manufacturing flow.

Conventional Techniques

Figure 1:
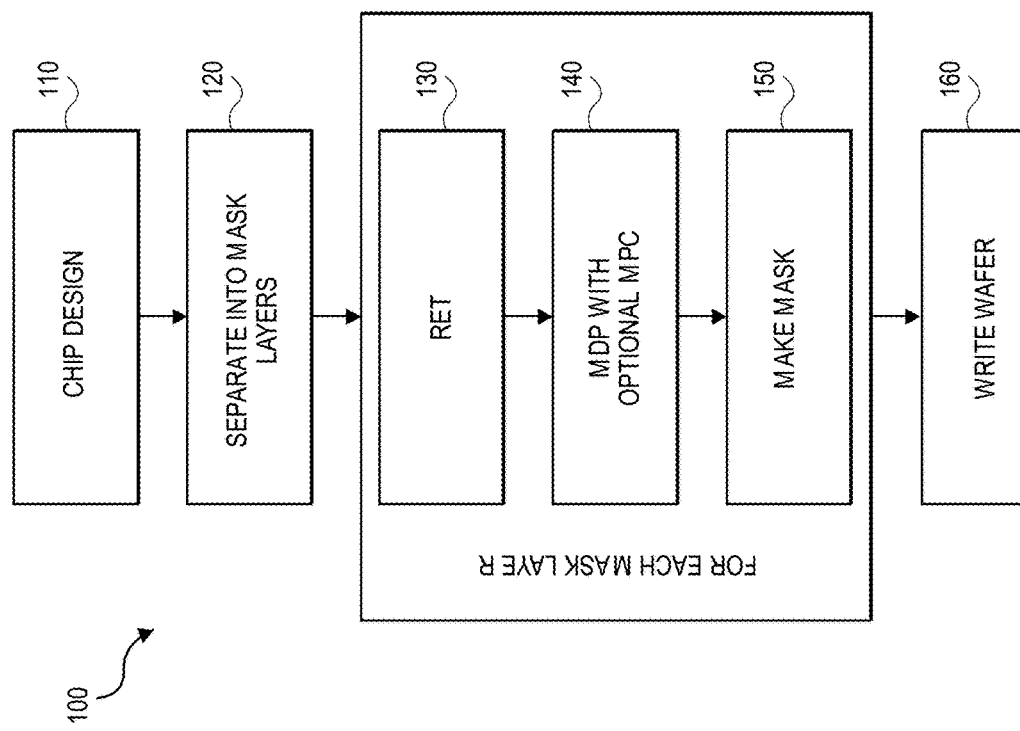
FIG. 1 is a block diagram of a chip design being processed into a wafer, as known in the art.

Traditional semiconductor manufacturing flow 100 is depicted in FIG. 1. Chip design is accomplished by creating a composite of wafer layers in step 110. In step 120, some of the wafer layers are separated into mask layers. This step also includes what is sometimes referred to as the coloring step, where each feature on a wafer layer is colored to reflect the assignment of a feature to a particular mask layer. Once the mask layers are separately identified, each mask layer goes through the RET step 130. Mask Data Preparation (MDP) step 140 then prepares the data for a mask writer. This step may include "fracturing" the data into trapezoids, rectangles, or triangles. It may also include creating shots or a shot list. Mask Process Correction (MPC) geometrically modifies the shapes and/or assigns dose to the shapes to make the resulting shapes on the mask closer to the desired shape. MPC is sometimes performed in step 130, sometimes in step 140, sometimes in step 150, and sometimes in any combination. A mask is made and verified in step 150, which includes such steps as mask writing, mask inspection, metrology, mask defect disposition, mask repair, and wafer-plane inspection of the mask. In step 160, the wafer is written using a successive collection of the masks made in step 150.

In each of the steps in FIG. 1, there may or may not be a verification step to thoroughly verify or sanity check the output of that step. In the art, some of the steps of FIG. 1 are performed in a different sequence or in parallel. An example of pipelined processing in a semiconductor manufacturing process is when a design is divided into multiple tiles, for example an array of equal-sized tiles, and then a first step is performed for a tile, and then a second step is performed for that tile without waiting for the other tiles to finish the first step. For example, RET step 130 and MDP step 140 may be pipelined to reduce the turnaround time. In another example, the MPC of step 140 may be pipelined with the mask making of step 150.

In wafer lithography, features that are needed on the substrate, referred to in the industry as main features, are found to print with greater fidelity and improved process window if extra features are added to the mask that are too small to print themselves, but nevertheless favorably affect the way nearby main features print. These extra features are called sub-resolution assist features (SRAFs). They are isolated shapes, unattached to a main feature, and are small enough not to print on the substrate.

Computing SRAFs and main feature modifications is highly compute-intensive with fragile results. Spurious extra patterns may print, the target pattern may not be fitted well, and the process window may be needlessly limited. A typical RET method has OPC verification to identify and correct hot spots. A hot spot is an area requiring ideal conditions to print properly and therefore is not resilient to manufacturing variation, or in some cases would not print properly even in ideal conditions. Hot spots lead to poor yield.

Figure 2A:
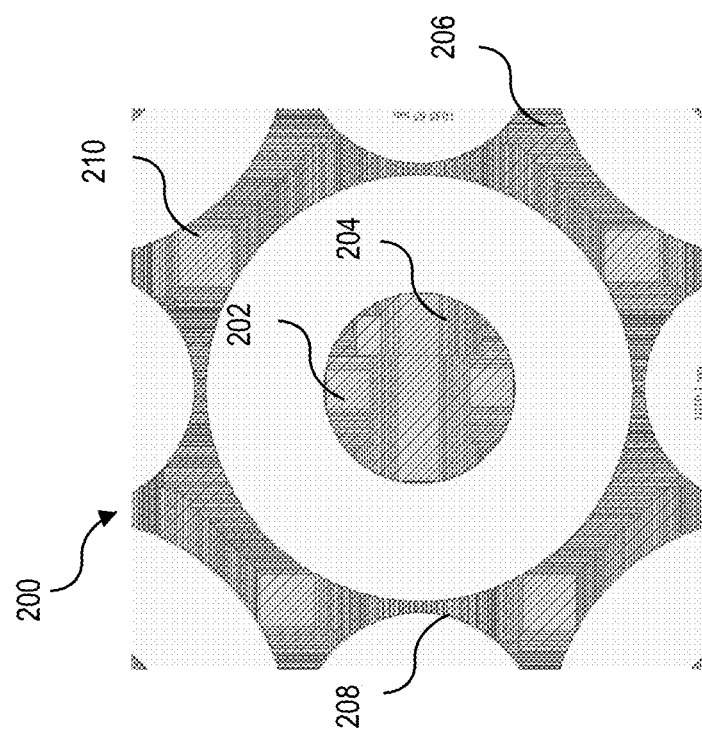
FIG. 2A and FIG. 2B show an example of VSB shots vs. multi-beam shots, as known in the art.

ILT often generates unexpected mask patterns which provide excellent results. ILT algorithms naturally create curvilinear shapes including many SRAFs. ILT algorithms targeted for VSB therefore spend considerable runtime to convert the curvilinear shapes into an approximation that is more suitable for VSB writing, often referred to as Manhattanization, creating rectangles for each VSB shot 202, 204, 206, 208 and 210, for example. Curvilinear shapes have proven to be impractical for variable shaped beam (VSB) mask writing machines with conventional fracturing because very many VSB shots such as shots 202-210 are required to expose the curvilinear shapes. For example, as shown in FIG. 2A, pattern 200 is a curvilinear shape formed from a plurality of VSB shots such as shots 202-210. Mask write times are a critical business factor, and VSB writing time scales with the number of VSB shots that need to be printed.

Figure 2B:
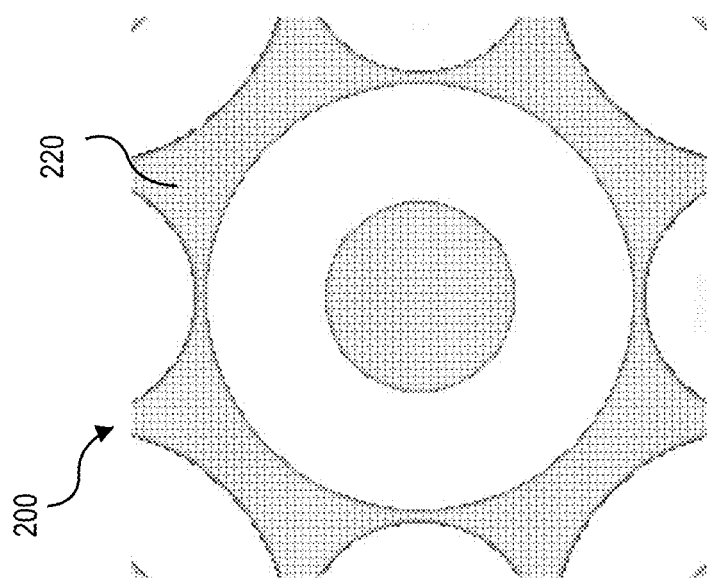

Curvilinear shapes take longer to write with conventional fracturing, or Manhattanization, using VSB. FIG. 2B shows how multi-beam mask writing systems write curvilinear shapes directly on a mask without taking any additional time. A multi-beam system is a charged particle beam system that has a plurality of individually-controllable beamlets. In FIG. 2B, each pixel 220 of pattern 200 is exposed by a beamlet of a multi-beam writer. Multi-beam enables ILT to output curvilinear shapes without the need for Manhattanization. The remaining problem with ILT is the huge computational demands of dense simulations of all mask layers of entire designs, particularly full-reticle sized designs, which for semiconductor manufacturing is typically around 3.0 cm×2.5 cm in wafer dimensions.

Figures 3A, 3B:
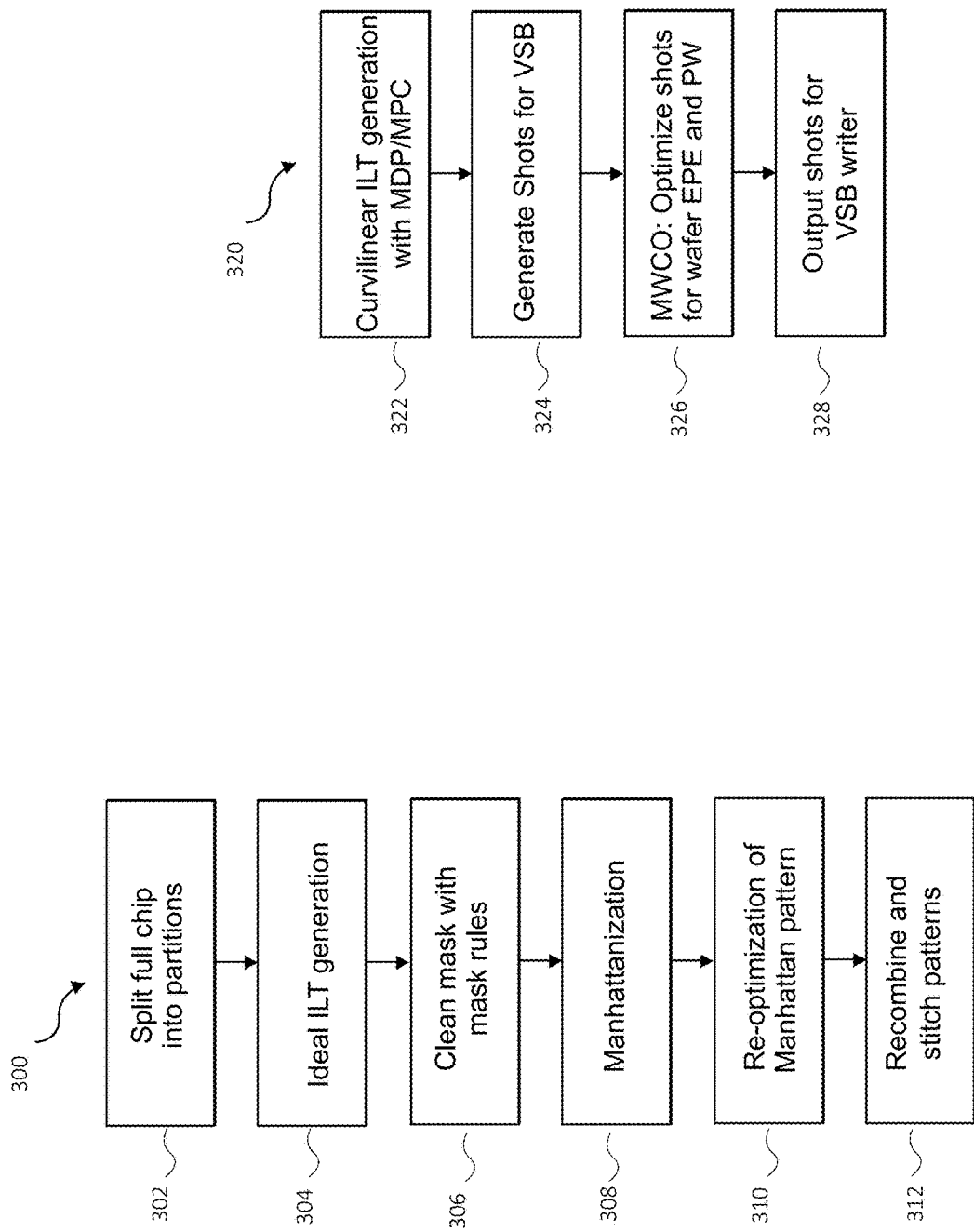
FIG. 3A is a flowchart outlining steps for ILT, as known in the art.
FIG. 3B is a flowchart for combining curvilinear ILT and Mask Data Preparation (MDP), using Mask Wafer Co-Optimization (MWCO), in accordance with some embodiments.

FIG. 3A shows a conventional ILT flow 300 for producing a full-chip mask pattern to be written by a VSB system. To handle the computational demands of dense simulation, a full-reticle design is partitioned into regions that are computed separately from each other in step 302. That is, the full chip is split into partitions. In step 304, ideal ILT generation is performed in which each partition is subjected to iterative optimization algorithms to adjust mask features within the region until the predicted pattern on wafer is within acceptable tolerances to be manufactured. Independently, or in-line with step 304, the mask pattern for each partition may be adjusted or cleaned to meet a set of mask rules in step 306. In order for the mask to be written using VSB, the cleaned mask pattern for each partition undergoes Manhattanization in step 308. The Manhattan pattern may be re-optimized for the partition as shown in step 310. After the Manhattan patterns for all partitions have been optimized, the patterns are recombined in step 312 to form the full-chip design, with any necessary stitching to ensure the patterns on the edges of adjacent partitions align within acceptable tolerances to be manufactured.

Mask printability and resilience to manufacturing variation are important considerations for mask shapes output by ILT, whether they are printed using VSB or multi-beam. For example, shapes that are too small or too close to each other, or have too sharp a turn in the contours of the shapes, make it too difficult to make the masks reliably, especially across manufacturing variation.

The energy delivered by the electrons from an eBeam machine is often approximated as a point-spread function (PSF). While there are many effects that affect how the energy is spread, in eBeam-based mask-making either for VSB or for multi-beam writing, a monotonic continuous PSF is a reasonable representation of the energy distribution. In this disclosure, for ease of comprehension, a single Gaussian distribution may be used as the PSF, but the embodiments apply to any suitable PSF, such as with up to three Gaussian distributions.

When the energy is delivered across a big enough area at nominal dose in a Gaussian distribution, there is ample dose for the interior of the area to reach nominal dose. But if the area is small, the highest dose in the interior of the area does not reach nominal dose. Similarly, if the spacing between areas is large enough, the lowest dose reaches zero. But if the spacing is small, the lowest dose does not reach zero. When either the area or the spacing between the areas is small, the dose profile is shallow. Mask manufacturing processes are designed to provide ample dose margin for a reasonable area and spacing, say 100 nm lines separated by 100 nm spaces with nominal dose for a typical leading-edge mask for 193i lithography. Smaller areas and spacings have lower dose margin at the contour edges of the areas. The smaller the area, the worse the dose margin, if the dose applied is nominal dose.

Dose margin also becomes worse for a typical mask writing process because of proximity effects. Mask writing with eBeam, whether VSB, CP, or multi-beam, has a back-scatter effect that is well known in the art. Electrons hit the resist surface, and secondary electrons released by the electrons bounce around to expose the resist in a 10-micrometer scale area around the exposed location. This has the effect of partially exposing the resist in the surrounding 10 micrometer scale area. Backscatter is considered a long-range effect. The aggregate of these partial exposures from all exposures surrounding a given area is significant enough to require correction. Software-based correction for backscatter and other long-range effects is called proximity effect correction (PEC) and is typically applied in line with the mask writer at the time of mask writing. PEC in essence decreases the nominal dose of a shot (or a pixel in the case of multi-beam) to compensate for the aggregate pre-dosing from the surrounding shots (or pixels). Nearly all production masks are written with PEC turned on in the machine. When the dose density of a 10-micrometer scale area is high, the amount of PEC applied is also high. This has the effect of reducing the height of the Gaussian (or PSF) of the exposure, and therefore reduces dose margin at the contour edges in that dense area. Therefore, a small shape written in an area of high dose density has worse dose margin than the same sized shape written in an area of low dose density.

Dose margin matters because a shallow slope means that a given percent dose change results in a larger difference in CD. Since dose margin is known by those skilled in the art to be a good proxy for a large variety, if not majority, of sources of manufacturing variation, measuring CD variation against dose variation is an important measure of resilience to manufacturing variation.

Details of Present Embodiments

Embodiments of the present disclosure describe methods, with variations to accommodate manufacturing conditions, for reticle enhancement technology (RET) for use with VSB lithography, although other manufacturing methods can also be improved using these RET methods. The present disclosure enhances the resolution achievable on the substrate, without a substantial increase in compute time or runtime to produce the reticle. Embodiments of the present disclosure involve techniques that shall be referred to as Mask Wafer Co-optimization (MWCO) to address two processes that can help each other to succeed: mask manufacturing and wafer production. For this disclosure, MWCO may have two goals. First, wafer process improves mask quality by optimizing with inverse lithography technology (ILT) for mask manufacturability. This involves performing ILT to create an initial mask pattern, which is used to determine a set of VSB shots, from which a new mask pattern is calculated. Second, the mask process improves wafer quality by optimizing during model-based MDP with overlapping shots for wafer quality. The result of combining these steps in an iterative flow is an optimized mask pattern. Thus, the present RET methods use wafer process as a cost to improve mask manufacture via ILT, in conjunction with using mask process to improve wafer quality via model-based MDP. That is, MWCO includes the initial mask pattern that is already optimized for mask manufacturability and then optimizes the set of VSB shots, determined from the initial mask pattern, for wafer quality.

Although curvilinear ILT is well suited to a pixel domain, its optimization can directly drive reducing Edge Placement Error (EPE) to meet optical proximity requirements for VSB. Prior to an optimization, the simulated wafer contour may not hit the wafer target. In some embodiments, after ILT optimization, VSB shots are adjusted so the simulated wafer contour can match the wafer target, reducing or eliminating EPE.

One goal for curvilinear ILT is to achieve the best process window. ILT has a much bigger process window (process conditions at different focus and dose), from −60 nm defocus to +60 nm defocus and from 93.3% dose to 106.7% dose variation, than OPC. A design with conventional OPC contacts may not print on a wafer evenly from the center of the array to edge of the array, some may have necking problems, or some may not even print at all. In contrast, design-optimized ILT images on the wafer can show very consistent print for all process conditions and all contacts no matter their location in the array, pitch, and angle of the rotation. An example of ILT is disclosed in U.S. Pat. No. 10,657,213, "Modeling of a Design in Reticle Enhancement Technology", which is owned by the assignee of the present application and is hereby incorporated by reference.

As shown in FIG. 3B, in accordance with some embodiments, the present disclosure uses a novel MWCO flow 320 that combines the benefits of curvilinear ILT and model-based MDP to calculate an optimized mask pattern and to output an optimized shot list to produce the mask with a VSB writer. The "optimized" mask pattern is optimized for mask manufacturability with ILT maximizing process window and the optimized shot list is optimized for wafer quality with model-based MDP while minimizing shot count for VSB thereby increasing turnaround time. Step 322 involves curvilinear ILT generation with MDP and may include MPC. Even as ILT creates curvilinear mask patterns, it still needs to meet mask rules because mask process, similar to lithography process, is limited or affected by dose profile and contrast, resist resolution and etching process. In some embodiments, step 322 may include a set of mask rules integrated into the ILT optimization to produce a Mask Rule Check (MRC) clean mask pattern. An initial set of shots for VSB is generated to produce the MRC-clean mask as shown in step 324. In step 326, the MWCO flow iteratively optimizes wafer EPE and process window (PW), while manipulating VSB shot edges to produce rectilinear target mask shapes. To accomplish this, MWCO incorporates mask-wafer double simulation in step 326 in addition to the ILT process, so that the output in step 328 is optimized for shot count for a VSB writer.

Curvilinear mask shapes, like conventional polygons, require Mask Data Preparation (MDP) and Mask Process Correction (MPC) so that mask writers can produce them with desired shape and dimensions. Full reticle MDP and MPC take significant run time, particularly in model-based MPC (required by EUV), making the total tape-out turn-around time longer.

Conventionally, a mask model is incorporated into an OPC model in order to skip a MPC step. However, many mask effects, such as effects due to etching, are not modeled in the OPC model. In addition, MDP and dose modulation in mask writing are not considered at all in the OPC model. In the present embodiments, to account for common mask effects such as those due to etching, MPC in step 322 may be accomplished using a simple mask model with a PSF such as a single Gaussian mask model and may include a constant etch bias. Alternatively a more complex mask model with multiple Gaussian distributions and a variable etch bias may be used. In some embodiments, MDP and dose modulation are accounted for by first sampling shots on a coarse grid. The shots and/or the mask pattern are further adjusted in the MWCO flow, resulting in a mask that is optimized to produce the best wafer pattern. In some embodiments, shots are adjusted in one or more iterations of MWCO calculations to eliminate the need for a separate MDP and MPC process.

MPC, which may be performed offline, pipelined, or in line with the mask writer, may manipulate shapes or doses applied to the mask in order to correct for linearity and enhance critical dimension uniformity (CDU) and line-edge roughness (LER) among other measures of resilience to manufacturing variation. Improving CDU and LER include enhancement of dose margin and improving the uniformity of dose margin across features in the mask. Enhancement of dose margin (edge slope) is disclosed in U.S. Pat. No. 8,473,875, "Method and System for Forming High Accuracy Patterns Using Charged Particle Beam Lithography", which is owned by the assignee of the present application. For masks to be written with VSB or CP writers, reduction in CD split also improves CDU. A CD split is when more than one shot is used to define the opposite edges of a critical dimension feature. An example of CD split is disclosed in U.S. Pat. No. 8,745,549, "Method and System for Forming High Precision Patterns Using Charged Particle Beam Lithography", which is owned by the assignee of the present application.

In a typical semiconductor manufacturing process, RET of step 130 in FIG. 1 produces a target mask shape. When a mask representation does not automatically satisfy all desired mask constraints and characteristics, such as allowed transmission values, minimum feature size, minimum spacing, or sufficient dose margin among others, an evaluation of a mask's suitability needs to introduce terms that add a cost related to the violation of these constraints. In the field of inverse problems, introducing these terms is known as regularization, and is a means of selecting a solution from a potentially infinite set of solutions that fits the desired outcome equally or similarly well but also has other a priori desirable properties. An example of inverse modeling for a mask is Fourier-ILT as disclosed in U.S. Pat. No. 7,856,612, "Lithography Mask Design Through Mask Functional Optimization and Spatial Frequency Analysis," which is owned by the assignee of the present disclosure and is hereby incorporated by reference. Some aspects of the present disclosure extend on Fourier-ILT and other RET systems and methods.

Figure 4A:
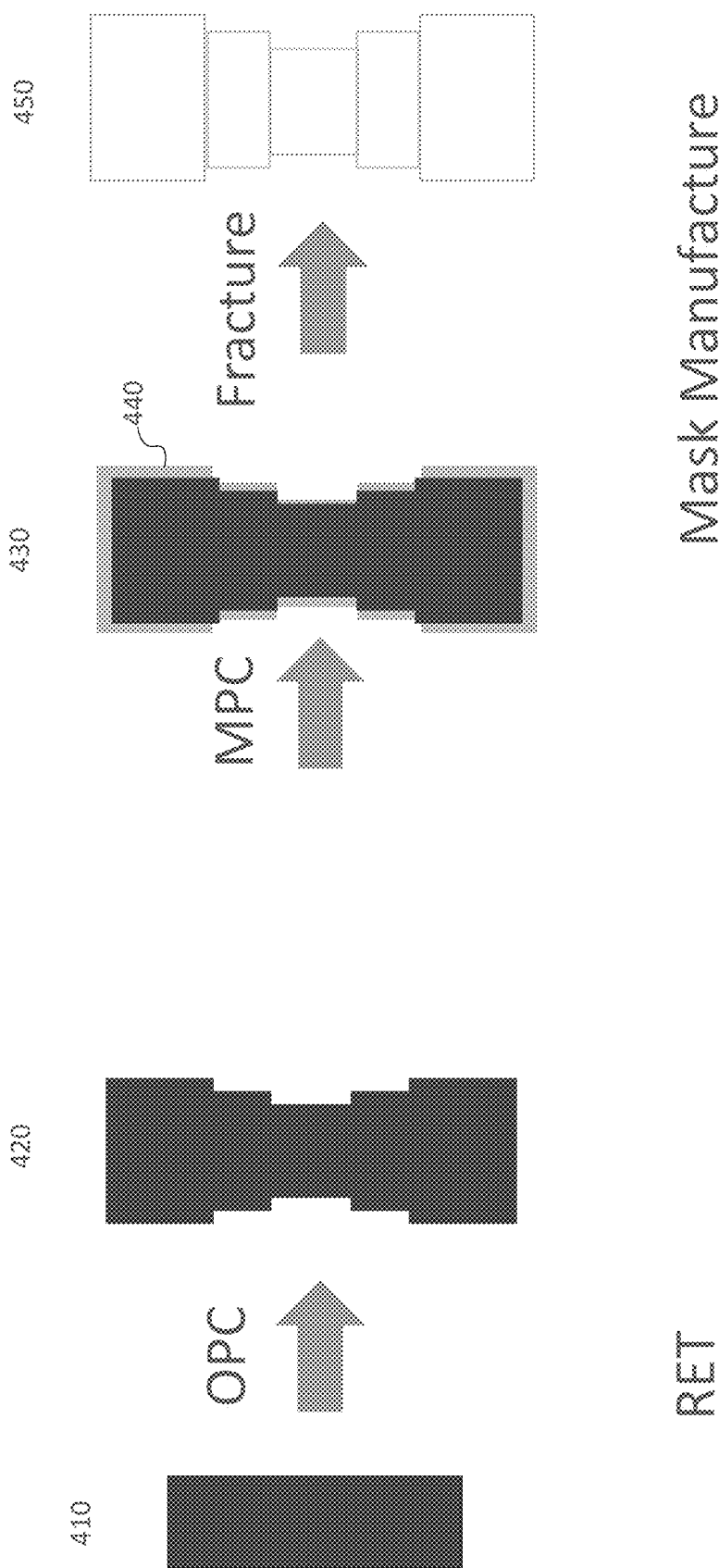
FIG. 4A illustrates RET outputting mask shapes, as known in the art.

FIG. 4A illustrates how conventional semiconductor manufacturing process separates RET and mask manufacture. Using OPC the desired mask shape 410 is optimized in order to achieve the best wafer pattern results. A post-OPC GDS/OASIS file describes the optimized mask shape 420. The mask is manufactured as close as possible to the shape optimized by OPC. MPC—either rule-based or model based—is run on the GDS/OASIS file containing the optimized mask shape 420, resulting in a mask shape 430 which is corrected for a manufacturing process window 440. The corrected shape (mask shape 430 with correction for process window 440) is then fractured into a set of rectangles 450, where each rectangle is a shot that a VSB mask writer writes.

Figure 4B:
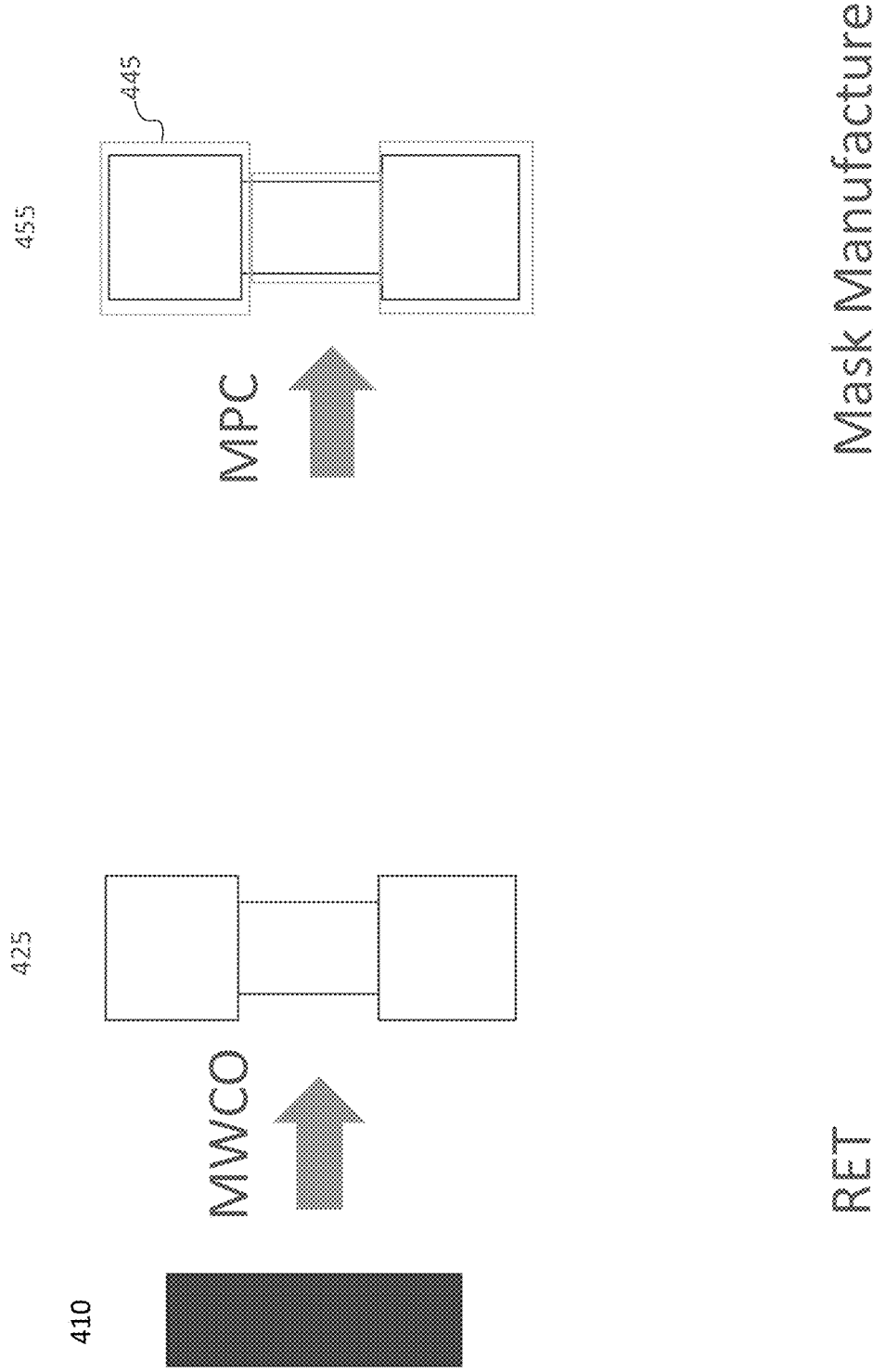
FIG. 4B illustrates Mask Wafer Co-optimization (MWCO) outputting a set of shots, in accordance with some embodiments.

FIG. 4B illustrates how MWCO combines an ILT process, overlapping shot generation and mask-wafer double simulation in accordance with embodiments, so that the mask shape 410 can be optimized for shot count as shot output 425. By using double simulation, wafer EPE is iteratively optimized while manipulating VSB shot edges to produce rectilinear target mask shapes that are known to be writable on a VSB writer, with an acceptable shot count. An example of double simulation is disclosed in U.S. Pat. No. 9,323,140, "Method and System for Forming a Pattern on a Reticle Using Charged Particle Beam Lithography", which is owned by the assignee of the present application and hereby incorporated by reference. MWCO outputs a set of VSB shots, instead of mask shapes. During mask manufacture, MPC with more accurate mask process models using a detailed mask model may still be run, producing shots 455 with additional correction 445, but fracturing of the mask shapes is no longer necessary. MWCO is able to deliver the set of VSB shots that the VSB mask writer can write, significantly improving the tape-out turnaround time. That is, the present methods provide benefits of reducing computing time since the set of shots for the mask are already suited for mask manufacturability, compared to conventional methods in which further fracturing of mask shapes is required during the mask manufacture stage.

Figure 5A:
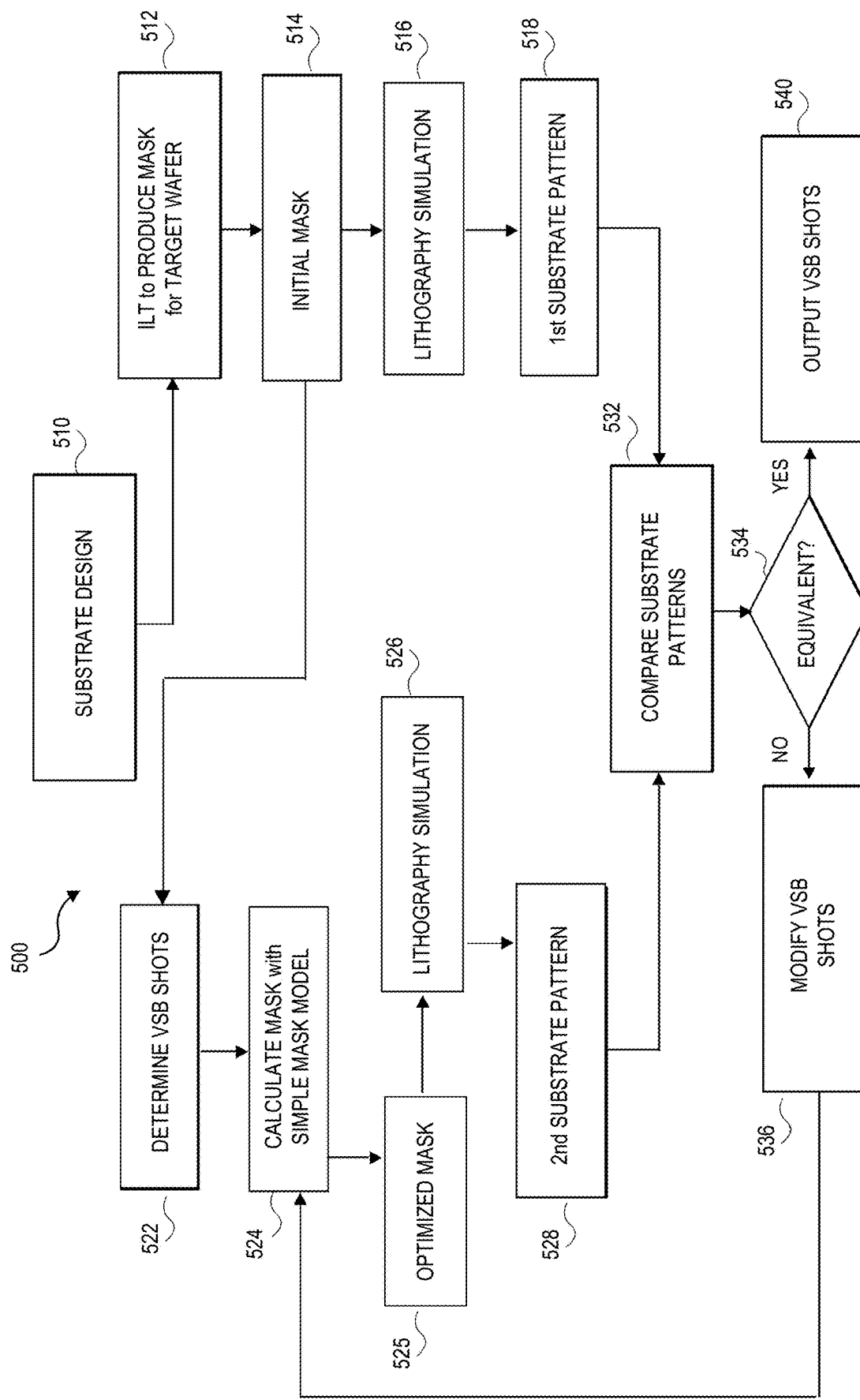
FIGS. 5A and 5B show flowcharts for combining curvilinear ILT and model-based MDP, using MWCO, in accordance with some embodiments.
Figure 5B:
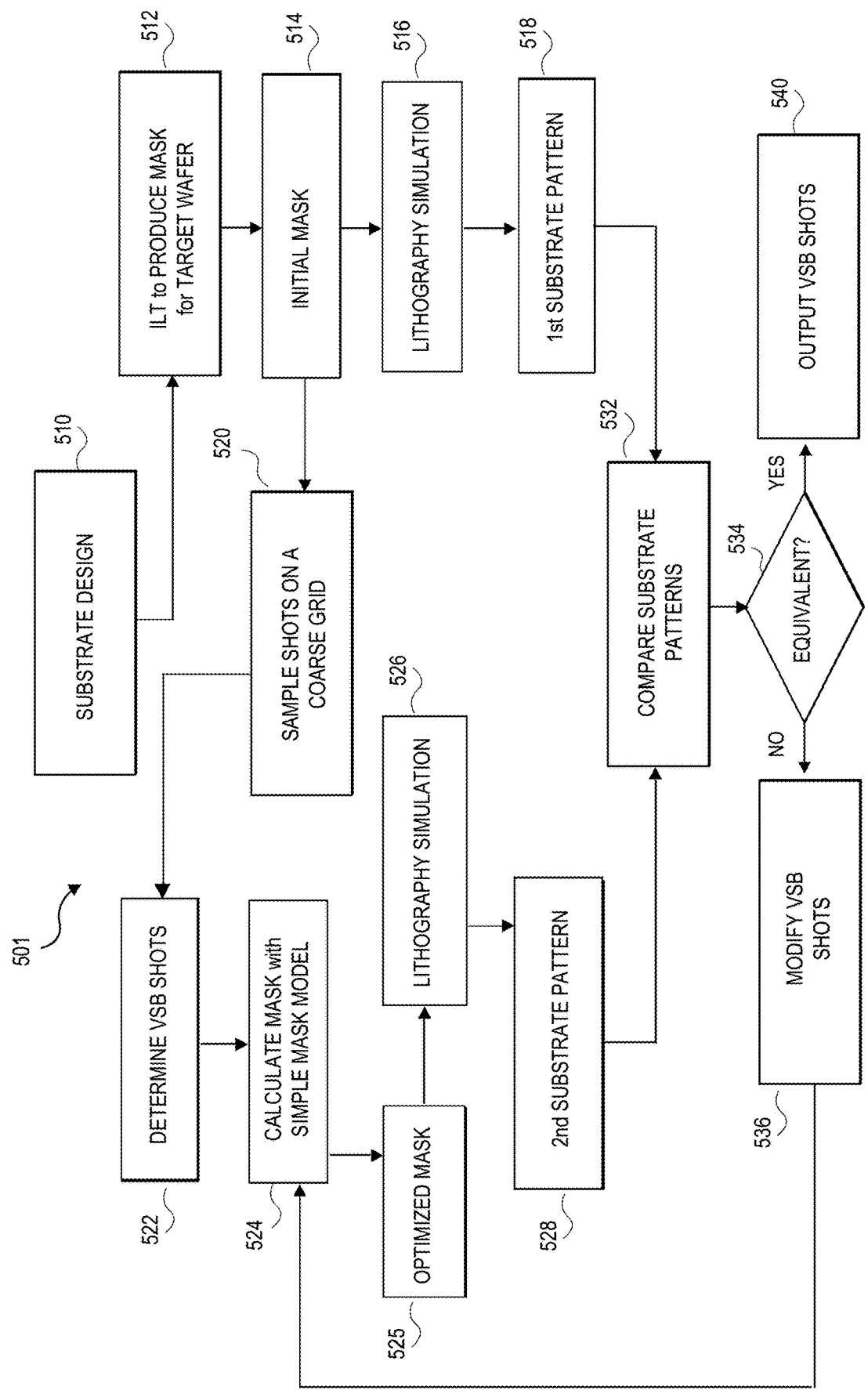

FIGS. 5A and 5B show how MWCO flows 500 and 501, in accordance with some embodiments, combine the benefits of curvilinear ILT and model-based MDP to optimize a set of shots for a mask pattern using a VSB writer. A substrate design, for example a target wafer pattern for a semiconductor chip, is input in step 510. The substrate design for the target wafer pattern is a desired pattern to be formed on a substrate and may be, for example, an entire mask layer of a semiconductor chip. The target wafer pattern spans an entire design area. Curvilinear ILT is used to produce desired curvilinear mask shapes for the substrate design in step 512. The product of the ILT process is an initial mask pattern 514 that is determined from the desired pattern for the substrate. In step 516, a first substrate pattern 518 is calculated from initial mask pattern 514, using optical lithography simulation. A set of VSB shots is determined in step 522 from the initial mask pattern 514. In step 524 a mask pattern is calculated using charged particle beam simulation from the set of VSB shots determined in step 522, using a simple mask model. The optimized mask pattern 525 that is calculated in the simulation process in step 524 is output and then used to calculate a second substrate pattern 528 using optical lithography simulation in step 526. The first substrate pattern 518 is compared to the second substrate pattern 528 in step 532 using EPE. The substrate patterns are equivalent when the EPE values are within a pre-determined tolerance in step 534. When the substrate patterns have been determined to be equivalent in comparison step 532, the set of VSB shots produced in step 522 is deemed accurate enough to produce the mask pattern, and the set of VSB shots is output for mask manufacture in step 540.

If the EPE values for first and second substrate patterns 518 and 528 are not within the pre-determined tolerance, the set of VSB shots is adjusted (i.e., modified) by either moving shots or resizing shots to minimize EPE in step 536. An optimized mask pattern is simulated from the modified set of VSB shots from step 536 using the simple mask model in step 524. The optimized mask pattern 525 is then used to simulate a revised second substrate pattern 528 with a lithographic model in step 526. The first substrate pattern 518 is compared to the revised second substrate pattern 528 as shown in step 532. The iterative optimization algorithm from step 532 to steps 534, 536, and returning to steps 524, 525, 526, 528 and 532 is repeated until EPE values for the revised second substrate pattern produced in step 528 and the first substrate pattern 518 are within a predetermined tolerance. When the first and revised second substrate patterns are within the pre-determined tolerance, the set of VSB shots is output in step 540 for mask manufacture.

FIG. 5B illustrates another flow 501 in which an initial set of VSB shots are first sampled on a coarse grid compared to FIG. 5A. In some embodiments, step 520 of flow 501 in FIG. 5B produces the initial set of VSB shots for step 522 by overlaying a coarse grid on an image of initial mask pattern 514. Sampling the grid at established intervals, for example 100 nm, the initial set of VSB shots can be formed by the union of the initial mask pattern with locations on the grid. Establishing intervals at a coarse range can be a first step to minimize shot count. The initial set of VSB shots can be used to calculate the mask pattern in step 524.

In an embodiment, the step of 522 may involve determining overlapping shots to produce SRAFs on the mask that do not print on the substrate, as well as non-overlapping shots to produce the main features with a shot count just large enough to produce the mask contours as specified by curvilinear ILT in step 512, for example. Overlapping shots further reduces shot count. Using MWCO flow 500 of FIG. 5A or flow 501 of FIG. 5B, MDP for overlapping shots is simulation-based, with iterative optimization to determine a set of VSB shots that produce the desired mask contour minimizing shot count and taking advantage of the natural corner-rounding in the mask process, which is especially prominent with SRAF dimensions. In a comparison study to judge the effectiveness of the MWCO flows described in this disclosure, without iteratively optimizing the set of VSB shots, the simulated second substrate pattern came within 2 nm EPE after mask-wafer double simulation. Because this process first produces the target curvilinear mask shapes using curvilinear ILT, and then separately optimizes the VSB shots to hit desired mask contours, the trade-off with shot count inevitably results in accuracy loss, such as this 2 nm EPE. The wafer results can be much improved with the iterative MWCO flow to revise the set of VSB shots. When the set of VSB shots to produce the mask contours were moved based on mask-wafer double-simulated wafer EPE, wafer EPE was reduced from 2 nm to 0 nm at the same location and less than 1 nm in all the shapes. Once the optimization target is changed from mask to wafer in the novel MWCO flow, shot count can be further reduced, since the scanner is a band-limited optical system that will filter out high frequency features on mask. Taking this approach to iteratively optimize VSB shot edges while optimizing for wafer EPE, without changing the shot count or shot configuration much, significantly improves the ability to target curvilinear mask shapes while minimizing impact on VSB shot count.

In embodiments, methods for reticle enhancement technology (RET) for use with variable shaped beam (VSB) lithography include inputting a desired pattern to be formed on a substrate (step 510); determining an initial mask pattern 514 from the desired pattern for the substrate; optimizing the initial mask pattern for wafer quality (e.g., iteration of steps 524, 525, 526, 528 and 532) using a VSB exposure system; and outputting (from step 524) the optimized mask pattern 525.

In some embodiments, optimizing the initial mask pattern includes determining an initial set of VSB shots (step 522) that will form the initial mask pattern; calculating a simulated mask pattern (step 524) from the initial set of VSB shots using charged particle beam simulation; and adjusting (step 536) the initial set of VSB shots or the initial mask pattern, thereby creating the optimized mask pattern. In some embodiments, the adjusting of the initial set of VSB shots creates an adjusted set of VSB shots; and the method further comprises outputting the adjusted set of VSB shots (step 540) with the optimized mask pattern. In some embodiments, the method further includes inputting a detailed mask model after the MWCO flow 500 or 501; modifying the adjusted set of VSB shots (following step 540) to create a modified set of VSB shots, wherein the modified set of VSB shots complies with the detailed mask model; and outputting the modified set of VSB shots for final manufacture; where even further embodiments include exposing a reticle with the modified set of VSB shots.

In some embodiments, the calculating of the simulated mask pattern (step 524) uses a simple mask model. The simple mask model may be a single Gaussian distribution and/or may include a constant etch bias.

In some embodiments, the methods may also include calculating a first substrate pattern 518 from the initial mask pattern; and calculating a second substrate pattern 528 from the simulated mask pattern. Calculating the first substrate pattern and the second substrate pattern may be performed using lithography simulation (steps 516, 526). In some embodiments, optimizing the initial mask pattern further comprises comparing (step 532) the first substrate pattern with the second substrate pattern; and optimizing the initial mask pattern can further include resizing or moving one or more shots in the adjusted set of VSB shots, thereby forming an optimized set of shots. Methods may include using the simple mask model to calculate the optimized mask with the optimized set of shots using charged particle beam simulation (step 526).

In some embodiments, the initial mask pattern is curvilinear. In some embodiments, the initial mask pattern is rectilinear. In some embodiments, the determining optimizes for mask manufacturability. In some embodiments, the determining of the initial mask pattern further comprises inverse lithography technology (step 512).

Optimizing for Mask Manufacturability

Figure 6:
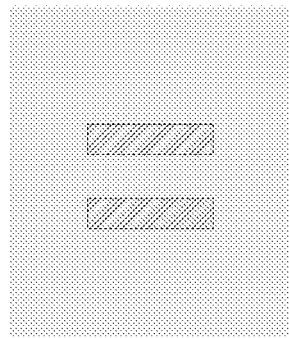
FIG. 6 shows a rasterized mask pattern based on a reticle target and curvilinear mask pattern, in accordance with some embodiments.
Figure 6:
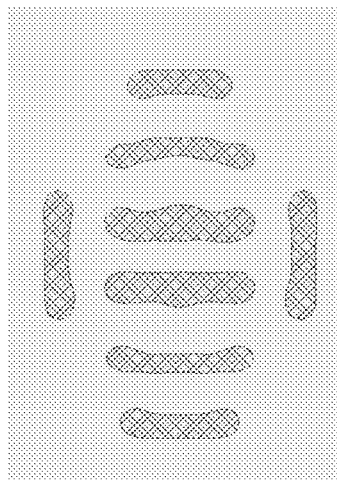
Figure 6:
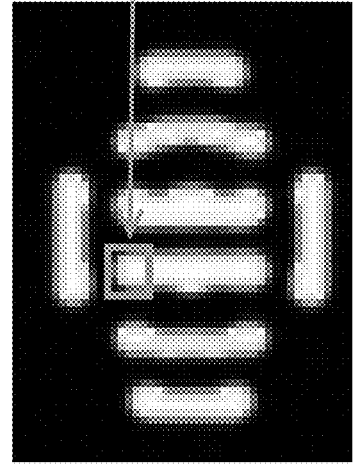
Figure 6:
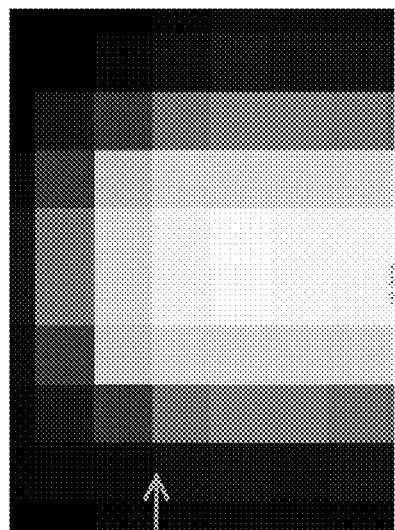

As shown in FIG. 6, in some embodiments of the present disclosure, a set of VSB shots are generated based on a mask pattern 620 which has been optimized for mask manufacturability with curvilinear ILT and the set of VSB shots sampled on a coarse grid. The coarse grid in this disclosure can be defined as a 100 nm grid. In other embodiments, a coarse grid may be 80 nm to 120 nm grid, or greater or smaller than 100 nm. For example, the grid size may be sized to accommodate the size of the shapes in the pattern. Using curvilinear ILT optimization algorithms, curvilinear mask features 620 can be calculated from rectilinear substrate features 610. Mask geometry 630 (also shown in view 640 which is a closer view of a portion of mask geometry 630) show how a curvilinear mask pattern, such as initial mask pattern 514 of FIGS. 5A and 5B, can be overlayed on the coarse grid, such as a 100 nm grid. Each mask pattern has dose values and feature sizes based on the input substrate design and lithographic model. The dose values are represented by different shades of gray.

The calculation of the simulated mask pattern in step 524 from the initial set of VSB shots, uses a simple mask model. The simple mask model has a PSF such as a single Gaussian distribution and may include a constant etch bias. Simulation with a simple mask model takes less time than with a more complex mask model. As needed, contours are extracted from the initial mask pattern by sampling the initial mask pattern on the coarse grid to obtain grid-based mask geometry 630, and from a closer view 640. This grid-based geometry is used to establish the initial set of VSB shots in step 520 and modify it in future iterations in step 536 in FIGS. 5A and 5B.

Figure 7:
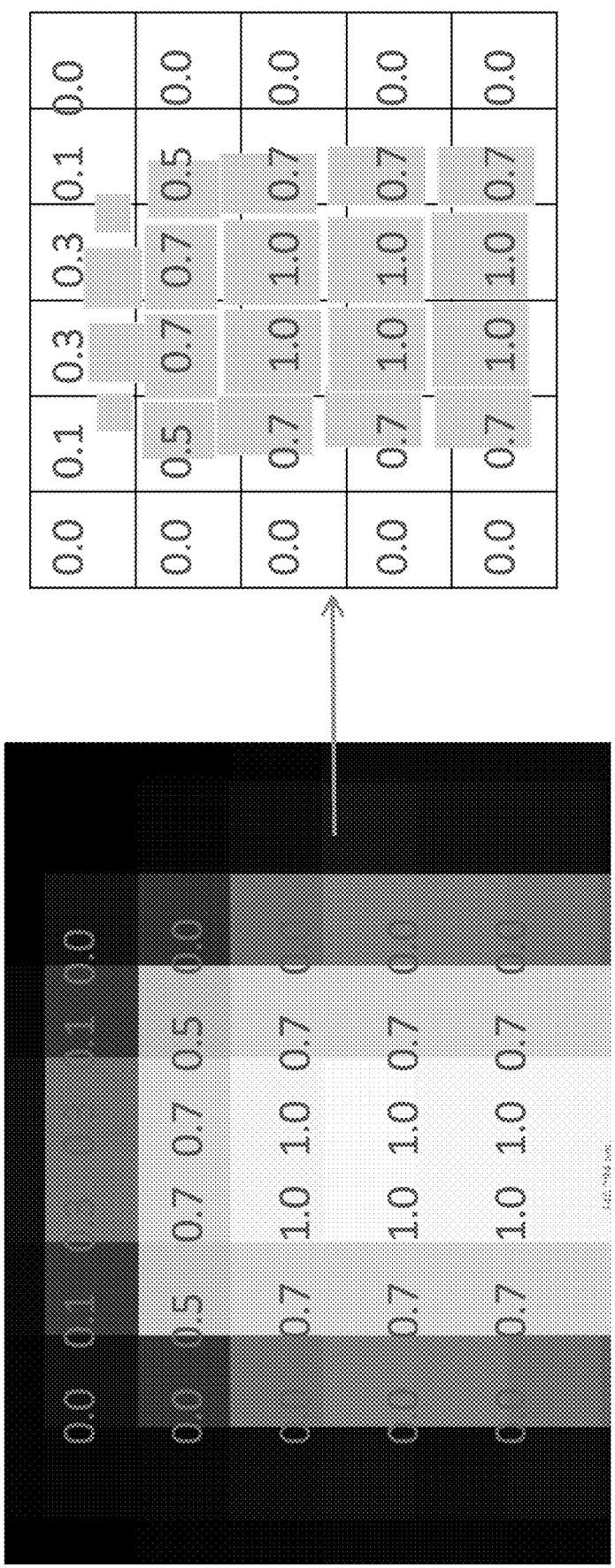
FIG. 7 shows shots from a rasterized mask pattern sampled at 100 nm, in accordance with some embodiments.

As shown in the example in FIG. 7, the initial mask pattern (similar to view 640 of FIG. 6) can be sampled on a dose map 740 to produce a 100 nm grid 750, where each non-zero dose of the initial mask pattern on the dose map 740 becomes a 100 nm×100 nm VSB shot location in grid 750, and the shot's dose corresponds to the dose value where the location intersects with the initial mask pattern. Determining the shots on an edge of the pattern depends on both the dose of the shots and nearby dose values. For example, a shot dose 0.7 in 740 will correspond with a shot size, occupying a grid location indicated with the shot dose 0.7, in grid 750.

Figure 8:
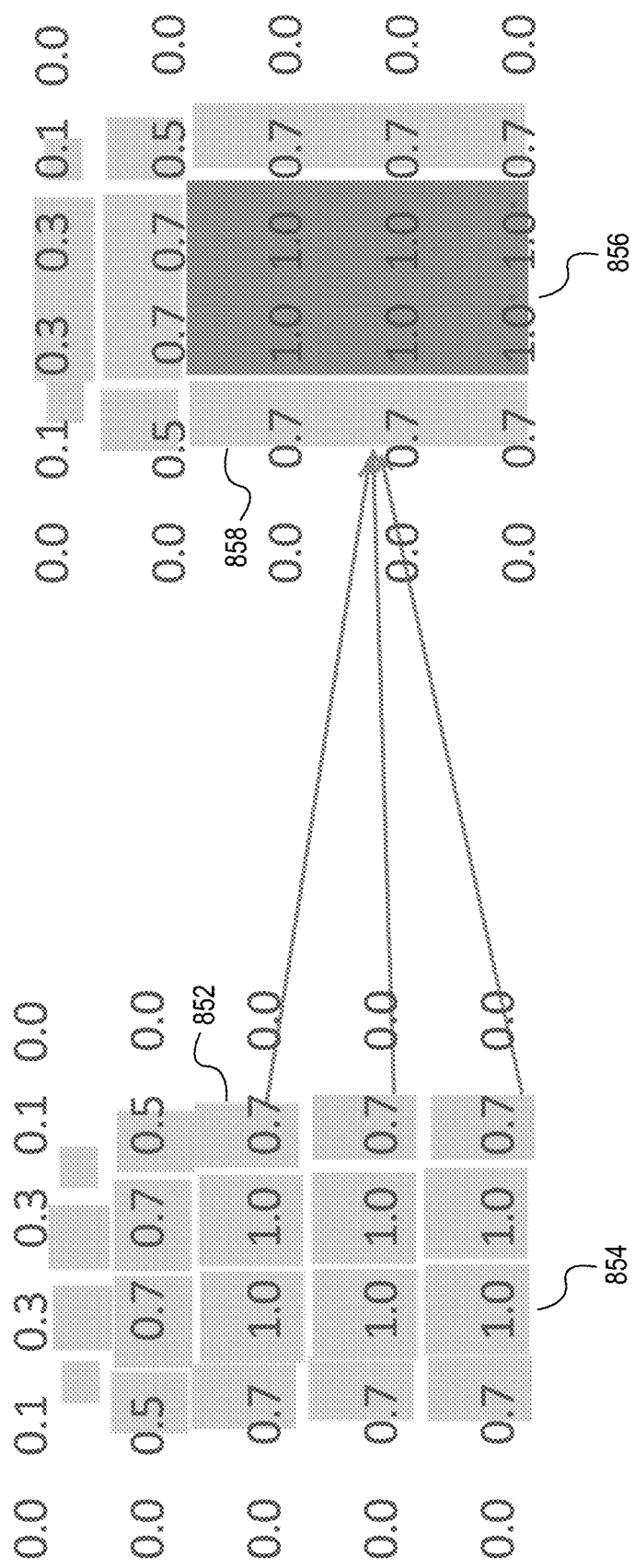
FIGS. 8 and 9 show merging shots on a contour boundary and freezing inner shots, in accordance with some embodiments.

FIG. 8 shows an embodiment in which neighboring shots 852 sharing an edge and the same dose value can be merged together into bigger shots 858 to reduce the shot count. Inner shots 854 that do not define a mask contour boundary can be frozen as indicated by region 856. Those inner shots that are frozen do not require further optimization; their dosages are fixed and will not change during the optimization iterations.

Figure 9:
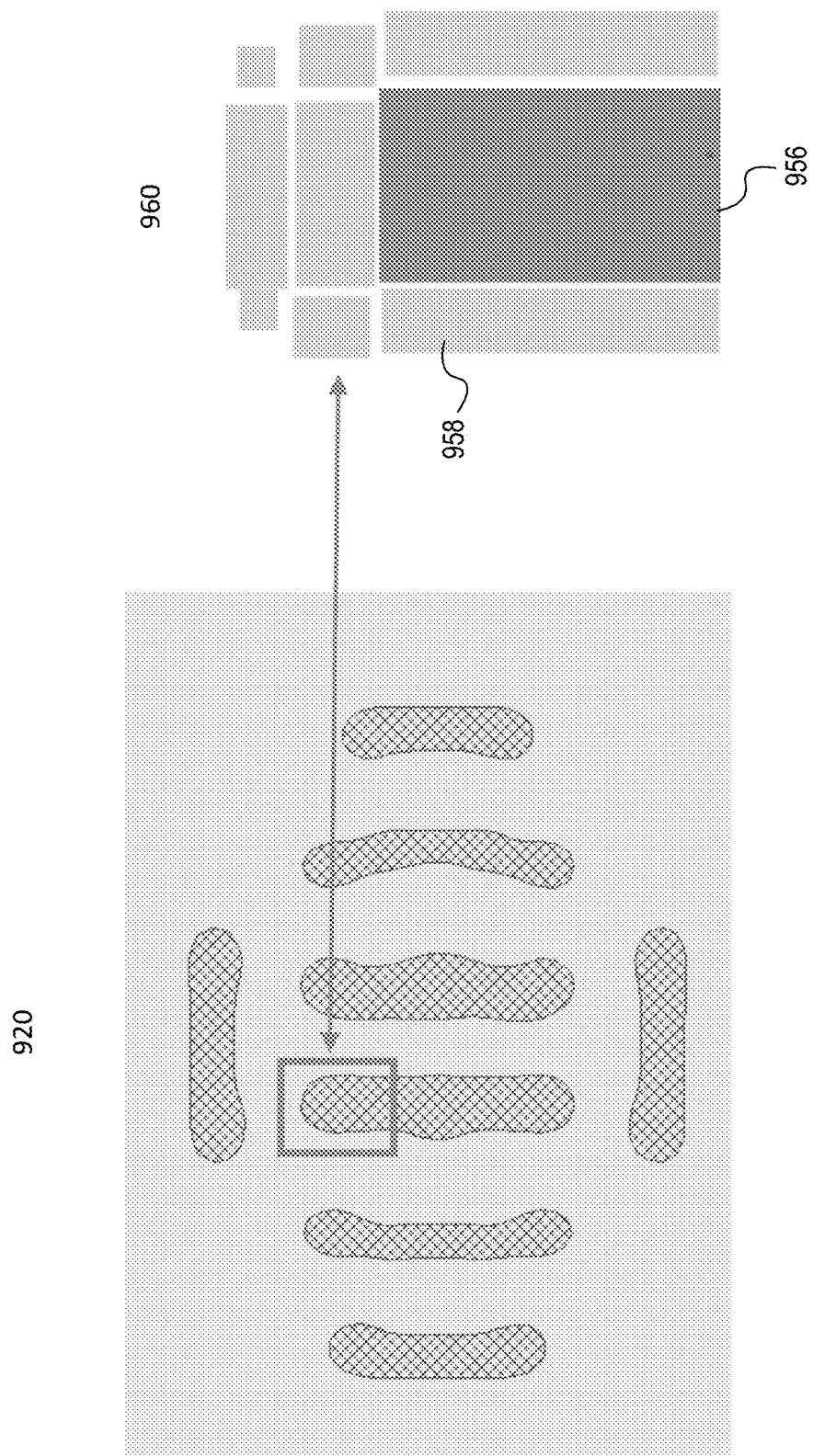

FIG. 9 shows how through MDP, the present methods can streamline the optimization of a mask pattern with curvilinear ILT 920 by first sampling on a coarse grid, freezing the inner shots 956, then optimizing only the contour-defining shots 958 as shown in view 960 (close-up view of an end of a feature from curvilinear ILT 920), with each step reducing the number of shots. For narrow shapes, 100 nm sampling may be too coarse and therefore finer sampling such as less than 100 nm may be used. That is, the grid sizes can be adjusted according to the sizes of the shapes so that, for example, at least one grid point intersects the shape.

Figure 10B:
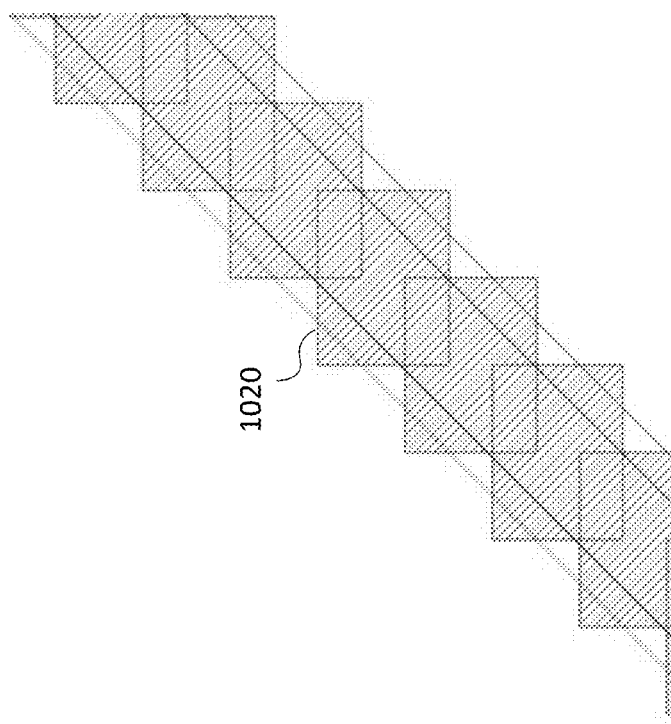
FIGS. 10A and 10B show conventional shots vs. overlapping shots, in accordance with some embodiments.
Figure 10A:
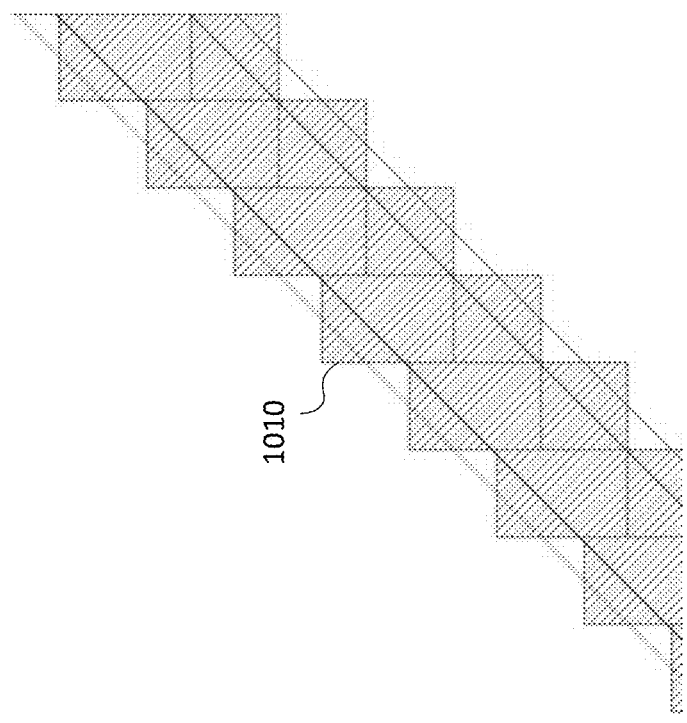

In some embodiments, further reduction of the number of shots in the set of VSB shots can be made with overlapping shots. FIG. 10B shows that using overlapping shots, rather than conventional shots that do not overlap as in FIG. 10A, may allow patterns to be written with reduced shot count and extra energy applied in overlapping areas, with no mask-quality compromise. As shown in FIG. 10B, only 64 overlapping shots 1020 are required to produce the same mask feature with 0 wafer EPE as with 120 conventional shots 1010 in FIG. 10A. With this method, the overlapping shot count is almost twice as efficient with the same wafer EPE. Overlapping shots cast more energy in less write time, offering a better process margin and better CDU than conventional shots. U.S. Pat. No. 7,754,401 also discloses use of dose modulation, where the assigned dosages of shots vary with respect to the dosages of other shots. The term model-based fracturing is used to describe the process of determining shots using the techniques of U.S. Pat. No. 7,754,401, which is hereby incorporated by reference.

Figure 11:
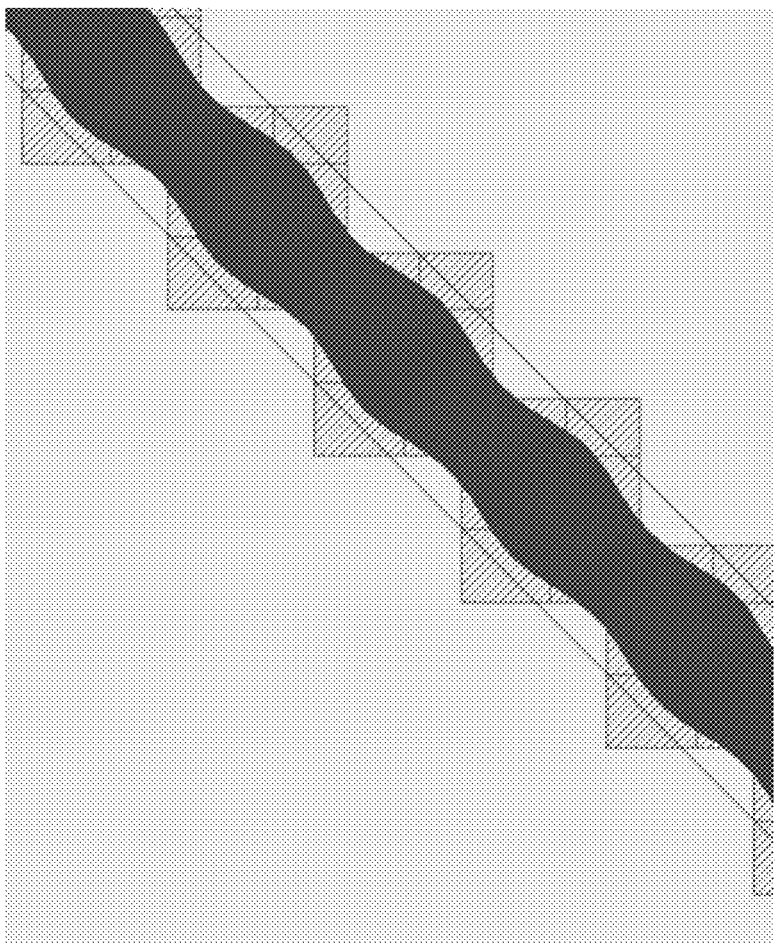
FIG. 11 shows band-limiting to filter out small jogs, in accordance with some embodiments.

In some embodiments, a band-limited scanner may be used to filter out small jogs as shown in FIG. 11, so that the jogs are effectively eliminated. In this example, a smooth contour is created from filtering jogs between shots.

Figure 12B:
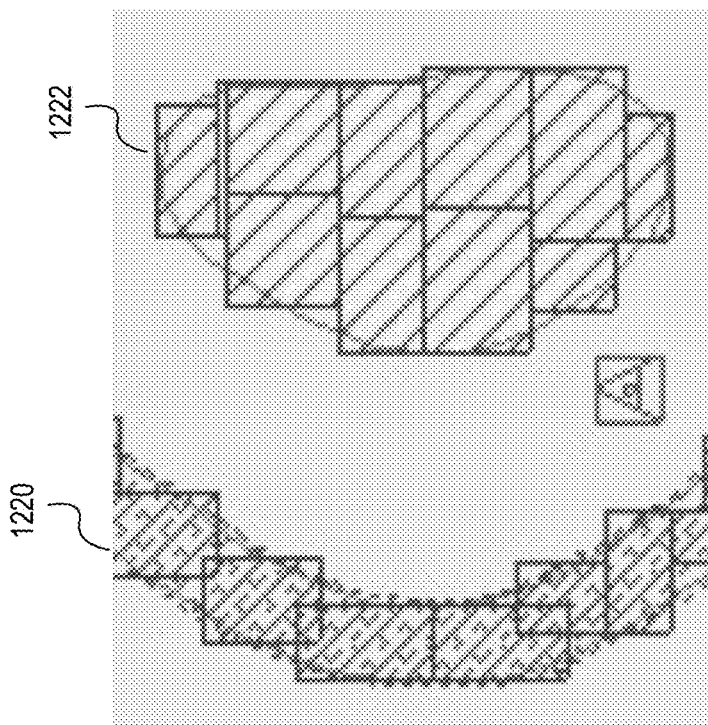
FIGS. 12A and 12B demonstrate fewer conventional shots for main features and overlapped shots for SRAFs in FIG. 12B than in FIG. 12A, in accordance with some embodiments.
Figure 12A:
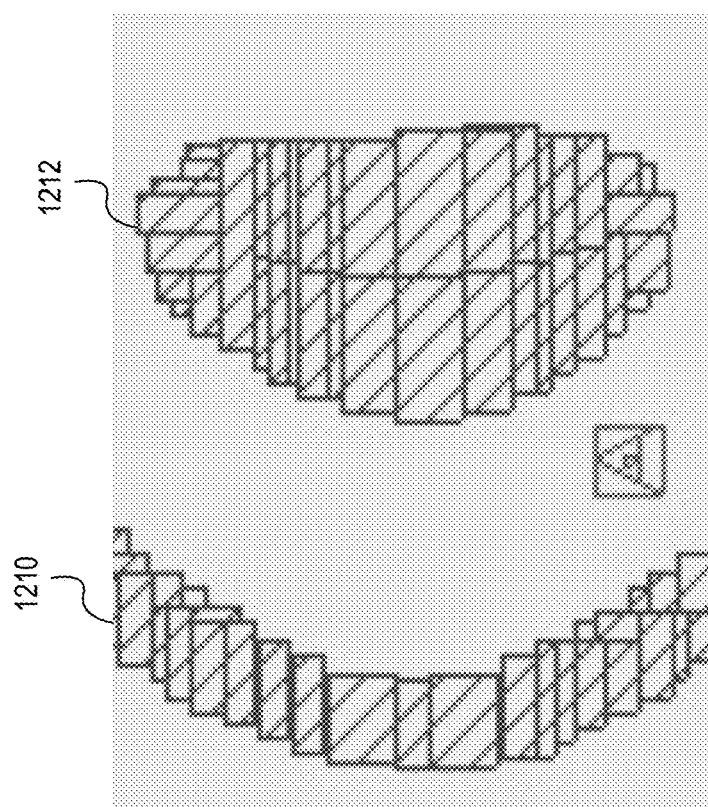

FIGS. 12A-12B show that write time and mask pattern fidelity can be balanced while using fewer conventional shots for main features that print on the wafer and by using overlapping shots for SRAFs that do not print on the wafer. FIG. 12A shows an SRAF 1210 on the left and a main feature 1212 on the right shot with conventional MDP shots for VSB. FIG. 12B employs MDP with overlapping shots to create the same SRAF 1220 and main feature 1222 according to some embodiments. The majority of the shot count for any given mask is from curvilinear SRAFs. In a case study of a contact array with different densities, over 80% of the shots were needed to create the curvilinear SRAFs. Because SRAFs have relatively little impact on wafer EPE, overlapping shots can be used on SRAFs to dramatically reduce shot count. Main features, on the other hand, have a large impact on wafer EPE; therefore, conventional shots can be used for more precision, as shown in FIG. 12B.

Figure 13:
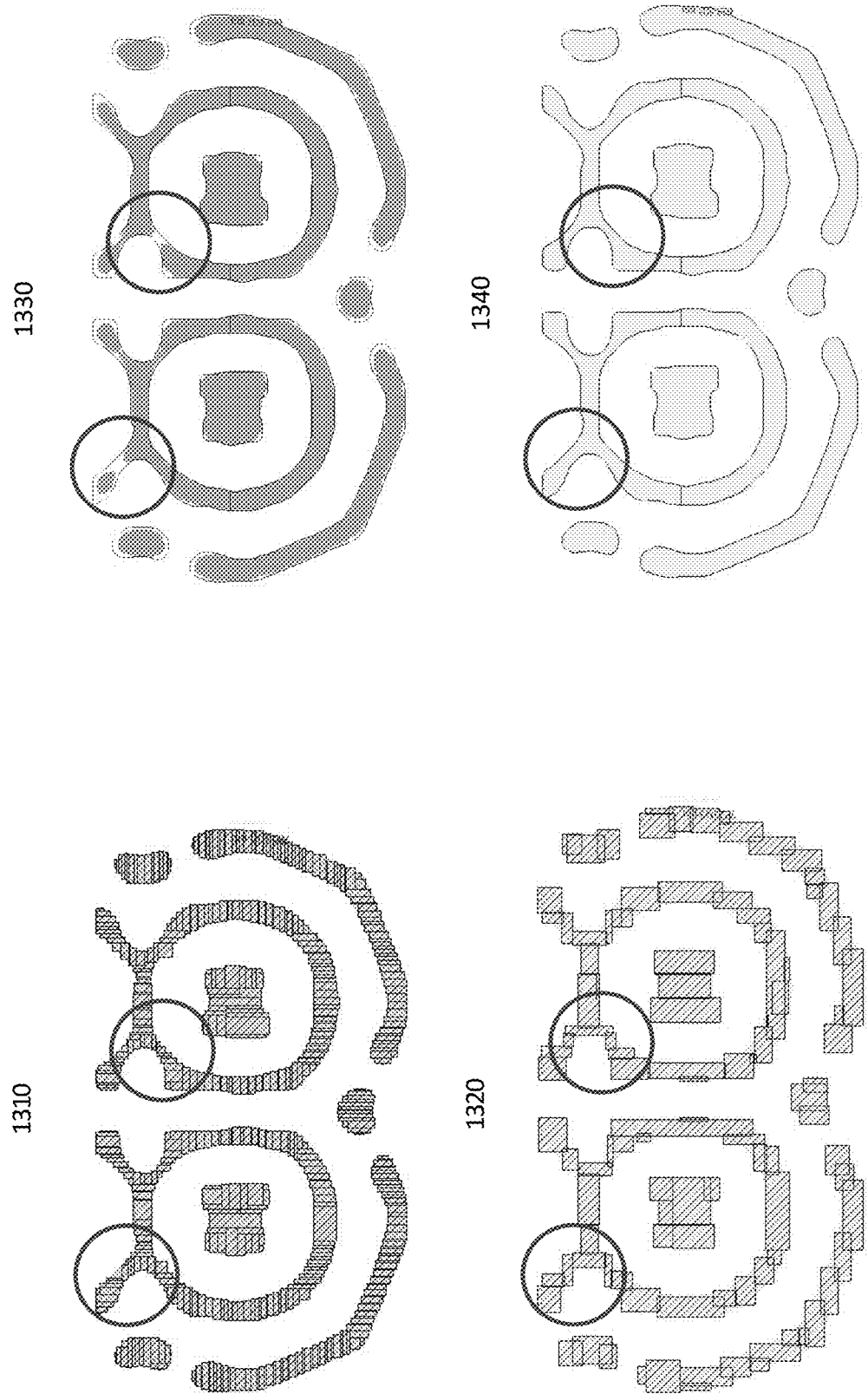
FIG. 13 shows overlapped shots with Mask Process Correction (MPC) improvements, in accordance with some embodiments.

The results in FIG. 13 show that overlapping shots combined with MPC can significantly improve curvilinear mask pattern fidelity and resilience. As shown in FIG. 13, overlapping shots is a technique to reduce shots and improve dose margin for angled lines and curvilinear features to be written by VSB mask writers. FIG. 13 shows a typical curvilinear ILT mask pattern, fractured in two ways for a VSB mask writer. Pattern 1310 uses 557 conventional MDP shots for VSB. Pattern 1320 employs MDP with 103 overlapping shots to create the same pattern. There are two observations from this example: first, overlapping shots can significantly reduce total shot count; and second, the majority of shots in this case (and in most production designs) are for SRAFs, which do not print, rather than for the main features. As known in the art, SRAFs have far less impact on the wafer edge-placement error (EPE) as compared to main features. For any given target main feature in a contact layer, an overwhelming number of shots are used for the SRAFs in a conventionally fractured solution. Overlapping shots produce SRAFs that perform well without devoting so much of the VSB write-time to producing them. When comparing the mask pattern 1330 produced by conventional methods (e.g., fractured pattern 1310) with the mask pattern 1340 produced by overlapping shots (e.g., fractured pattern 1320), mask pattern fidelity to the target contour is greater with the pattern 1340 produced by overlapping shots.

In some embodiments, a method for fracturing a pattern to be exposed on a surface using variable shaped beam (VSB) lithography includes inputting an initial pattern (step 510); overlaying the initial pattern with a two-dimensional grid (step 520), wherein an initial set of VSB shots are formed by the union of the initial pattern with locations on the grid (e.g., FIG. 7); merging two or more adjacent shots 852 in the initial set of VSB shots to create a larger shot 858 in a modified set of VSB shots; and outputting the modified set of VSB shots (step 540).

In some embodiments, the merging reduces the number of shots compared to the initial set of VSB shots. In some embodiments, a shot in the initial set of VSB shots is assigned a normal dosage where the initial pattern fully covers the location on the grid for the shot such as shot 854, and is assigned a less than normal dosage where the initial pattern partially covers the location on the grid of the shot such as shot 852. In some embodiments, the merging comprises merging a shot having the same dosage with an adjacent shot (shots 852), creating the larger shot 858 in the modified set of VSB shots.

In some embodiments, the initial pattern comprises main features (e.g., main feature 1222). In some embodiments, the modified set of VSB shots further comprises overlapping shots; where the overlapping shots may be used in SRAFs.

In some embodiments, the two-dimensional grid comprises an array of 100 nm by 100 nm regions. In some embodiments, the initial pattern is curvilinear. In some embodiments, the initial pattern is determined using Inverse Lithography Technology (ILT)

In some embodiments, the surface is a reticle or mask. The methods may include inputting a mask model; and calculating a calculated pattern to be exposed on the surface with the modified set of VSB shots, using the mask model. The mask model may comprise a single Gaussian distribution or a constant etch bias. The calculating may comprise charged particle beam simulation. The methods may include calculating a first substrate pattern 518 from the initial pattern; and calculating a second substrate pattern 528 from the calculated pattern to be exposed on the surface. Calculating the first substrate pattern and the second substrate pattern may comprise lithography simulation (steps 516, 526). Methods may further include optimizing the modified set of VSB shots by comparing (step 532) the first substrate pattern with the second substrate pattern. In some embodiments, the optimizing comprises resizing or moving one or more shots in the modified set of VSB shots, thereby forming an adjusted set of VSB shots. In some embodiments, the methods further include using the mask model to calculate an optimized mask with the adjusted set of VSB shots using charged particle beam simulation.

Computation Systems

The computation and processing steps described in this disclosure may be implemented using general-purpose computers with appropriate computer software as computation devices. Multiple computers or processor cores may also be used in parallel. In some embodiments, a special-purpose hardware device, either used singly or in multiples, may be used to perform the computations of one or more steps with greater speed than using general-purpose computers or processor cores. In certain embodiments, the special-purpose hardware device may be a graphics processing unit (GPU). In other embodiments, other special-purpose hardware devices may be used as co-processors, such as a Digital Signal Processor (DSP), a Tensor Processing Unit (TPU), a Field-Programmable Gate Array (FPGA), or an Application-Specific Integrated Circuit (ASIC).

Figure 14:
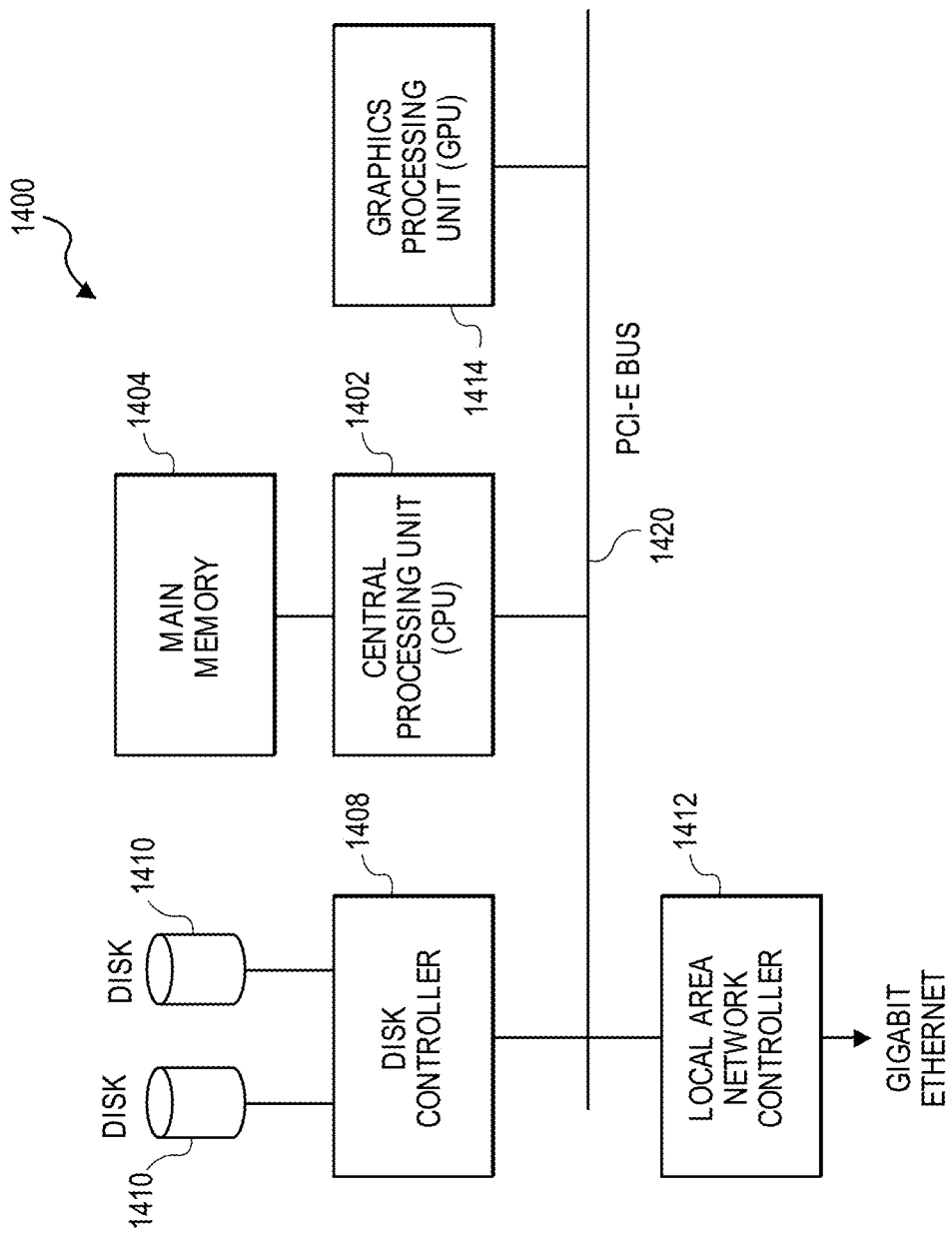
FIG. 14 is a block diagram of an embodiment of a computing hardware system that may be used in embodiments of the present disclosure.

FIG. 14 is a block diagram of an example of a computing hardware device 1400 that may be used to perform the calculations described in this disclosure. Computing hardware device 1400 comprises a central processing unit (CPU) 1402, with attached main memory 1404. The CPU 1402 may comprise, for example, eight processing cores, thereby enhancing performance of any parts of the computer software that are multi-threaded. The size of main memory 1404 may be, for example, 64 G-Bytes. The CPU 1402 is connected to a Peripheral Component Interconnect Express (PCIe) bus 1420. A graphics processing unit (GPU) 1414 may also be connected to the PCIe bus 1420. In computing hardware device 1400, the GPU 1414 may or may not be connected to a graphics output device such as a video monitor. If not connected to a graphics output device, GPU 1414 may be used purely as a high-speed parallel computation engine. The computing software may obtain significantly higher performance by using GPU 1414 for a portion of the calculations, compared to using CPU 1402 for all the calculations. The CPU 1402 communicates with the GPU 1414 via PCIe bus 1420. In other embodiments (not illustrated) GPU 1414 may be integrated with CPU 1402, rather than being connected to PCIe bus 1420. Disk controller 1408 may also be attached to the PCIe bus 1420, with, for example, two disks 1410 connected to disk controller 1408. Finally, a local area network (LAN) controller 1412 may also be attached to the PCIe bus, and provide Gigabit Ethernet (GbE) connectivity to other computers. In some embodiments, the computer software and/or the design data are stored on disks 1410. In other embodiments, either the computer programs or the design data or both the computer programs and the design data may be accessed from other computers or file serving hardware via the GbE Ethernet or other connectivity solutions such as Infiniband.

Figure 15:
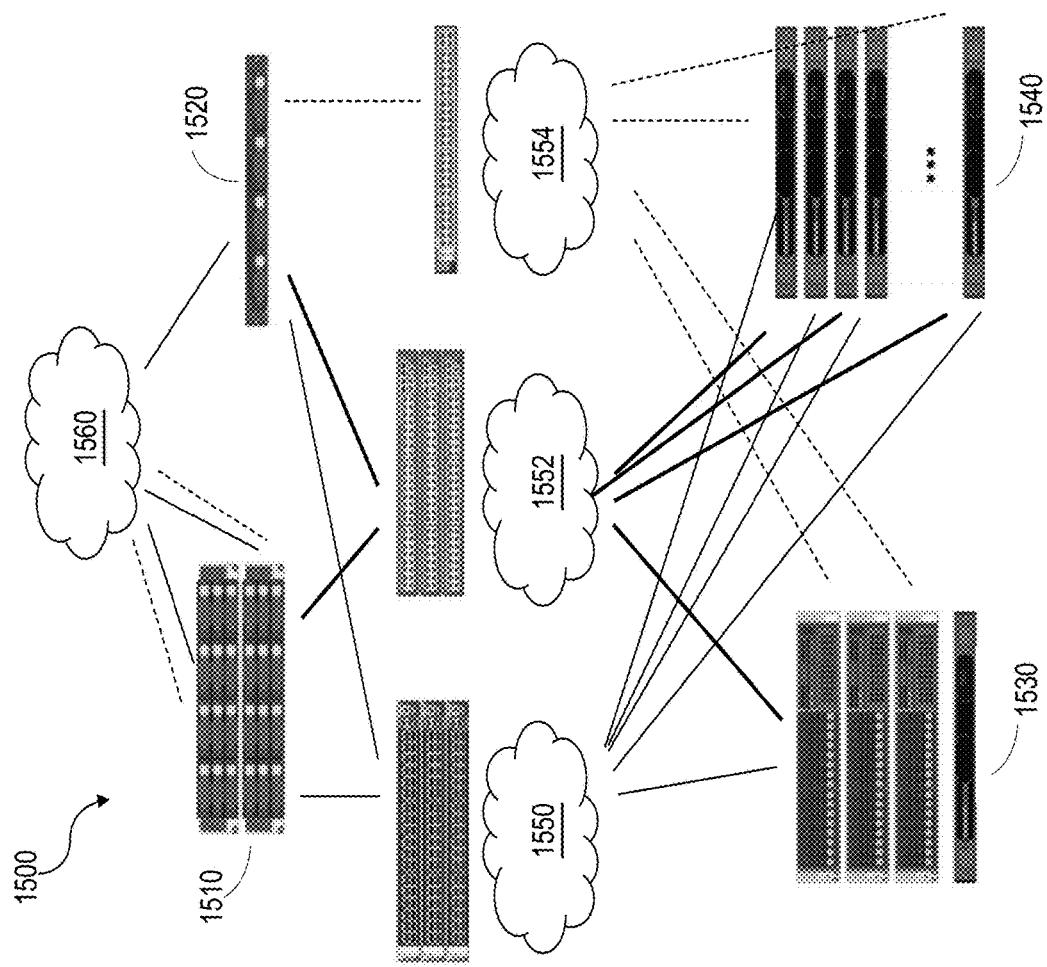
FIG. 15 is a block diagram of another embodiment of a computing hardware system, a Computational Design Platform (CDP), that may be used in embodiments of the present disclosure.

FIG. 15 is another embodiment of a system for performing the computations of the present embodiments. The system 1500 may also be referred to as a Computational Design Platform (CDP), and includes a master node 1510, an optional viewing node 1520, an optional network file system 1530, and a GPU-enabled node 1540. Viewing node 1520 may not exist or instead have only one node, or may have other numbers of nodes. GPU-enabled node 1540 can include one or more GPU-enabled nodes. Each GPU-enabled node 1540 may be, for example, a GPU, a CPU, a paired GPU and CPU, multiple GPUs for a CPU, or other combinations of GPUs and CPUs. The GPU and/or CPU may be on a single chip, such as a GPU chip having a CPU that is accelerated by the GPU on that chip, or a CPU chip having a GPU that accelerates the CPU. A GPU may be substituted by other co-processors.

The master node 1510 and viewing node 1520 may be connected to network file system 1530 and GPU-enabled nodes 1540 via switches and high-speed networks such as networks 1550, 1552 and 1554. In an example embodiment, network 1550 can be a 56 Gbps network, network 1552 can be a 1 Gbps network and network 1554 can be a management network. In various embodiments, fewer or greater numbers of these networks may be present, and there may be various combinations of types of networks such as high and low speeds. The master node 1510 controls the CDP 1500. Outside systems can connect to the master node 1510 from an external network 1560. In some embodiments, a job is launched from an outside system. The data for the job is loaded onto the network file system 1530 prior to launching the job, and a program is used to dispatch and monitor tasks on the GPU-enabled nodes 1540. The progress of the job may be seen via a graphical interface, such as the viewing node 1520, or by a user on the master node 1510. The task is executed on the CPU using a script which runs the appropriate executables on the CPU. The executables connect to the GPUs, run various compute tasks, and then disconnect from the GPU. The master node 1510 can also be used to disable any failing GPU-enabled nodes 1540 and then operate as though that node did not exist.

In some embodiments, the trial mask pattern is divided into a plurality of tiles, and the computer processor is further configured to compute a cost for each tile in the plurality of tiles, the computing of the plurality of tiles may be performed in a distributed process.

In general embodiments, the system is a computer processor, which in some embodiments can include graphical processing units or other co-processors for performing distributed computation, such as parallel processing. In some embodiments, the graphical processing units or other co-processors may be configured to interconnect with each other for fast communication.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed:

1. A system for fracturing a pattern to be exposed on a surface using variable shaped beam (VSB) lithography, the system comprising:
   a device configured to receive an initial pattern;
   a device configured to calculate a first substrate pattern from the initial pattern;
   a device configured to overlay the initial pattern with a two-dimensional grid, wherein an initial set of VSB shots are formed by a union of the initial pattern with locations on the grid;
   a device configured to merge two or more adjacent shots in the initial set of VSB shots to create a larger shot in a modified set of VSB shots;
   a device configured to calculate a calculated pattern to be exposed on the surface with the modified set of VSB shots; and
   a device configured to calculate a second substrate pattern from the calculated pattern to be exposed on the surface.

2. The system of claim 1, further comprising a device configured to output the modified set of VSB shots.

3. The system of claim 1, wherein the merging reduces a number of shots compared to the initial set of VSB shots.

4. The system of claim 1, wherein a shot in the initial set of VSB shots is assigned a normal dosage where the initial pattern fully covers a location on the grid for the shot, and is assigned a less than the normal dosage where the initial pattern partially covers the location on the grid of the shot.

5. The system of claim 1, wherein in the merging, the two or more adjacent shots have the same dosage.

6. The system of claim 1, wherein the initial pattern comprises main features.

7. The system of claim 1, wherein the modified set of VSB shots further comprises overlapping shots.

8. The system of claim 7, wherein the overlapping shots are used in SRAFs.

9. The system of claim 1, wherein the two-dimensional grid comprises an array of 100 nm by 100 nm regions.

10. The system of claim 1, wherein the initial pattern is curvilinear.

11. The system of claim 1, wherein the initial pattern is determined using Inverse Lithography Technology (ILT).

12. The system of claim 1, wherein the surface is a reticle or mask.

13. The system of claim 1, wherein the device configured to calculate the first substrate pattern and the device configured to calculate the second substrate pattern comprise lithography simulation.

14. The system of claim 1, wherein the device configured to calculate the calculated pattern is further configured to:
 receive a mask model; and
 calculate the calculated pattern to be exposed on the surface with the modified set of VSB shots, using the mask model.

15. The system of claim 14, wherein the mask model comprises a single Gaussian distribution.

16. The system of claim 14, wherein the mask model comprises a constant etch bias.

17. The system of claim 14, wherein the device configured to calculate the calculated pattern comprises charged particle beam simulation.

18. The system of claim 14, further comprising a device configured to optimize the modified set of VSB shots by comparing the first substrate pattern with the second substrate pattern.

19. The system of claim 18, wherein the optimizing comprises resizing or moving one or more shots in the modified set of VSB shots, thereby forming an adjusted set of VSB shots.

20. The system of claim 19, further comprising using the mask model to calculate an optimized mask with the adjusted set of VSB shots using charged particle beam simulation.

* * * * *